(12) United States Patent
Gockel et al.

(10) Patent No.: US 6,272,712 B1
(45) Date of Patent: Aug. 14, 2001

(54) BRUSH BOX CONTAINMENT APPARATUS

(75) Inventors: Thomas R. Gockel, Modesto; Lorin Olson, Scotts Valley; Lynn Ryle, San Jose; Brett A. Whitelaw, deceased, late of Pleasanton, by Tory Whitelaw, legal representative; Michael Ravkin, Sunnyvale, all of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/612,537

(22) Filed: Jul. 7, 2000

Related U.S. Application Data

(63) Continuation of application No. 09/285,356, filed on Apr. 2, 1999, now Pat. No. 6,119,295.

(51) Int. Cl.[7] ............................ A46B 13/02; B08B 11/00; B08B 13/00

(52) U.S. Cl. .............................. 15/77; 15/21.1; 15/88.3; 15/102

(58) Field of Search ................................ 15/77, 21.1, 88.3, 15/102

(56) References Cited

FOREIGN PATENT DOCUMENTS

| 3046733 | * | 7/1982 | (DE) | ............................... | 15/77 |
| 3300844 | * | 7/1984 | (DE) | ............................... | 15/21.1 |

* cited by examiner

*Primary Examiner*—Randall E. Chin
(74) *Attorney, Agent, or Firm*—Martine & Penilla, LLP

(57) ABSTRACT

A semiconductor processing system, such as a system for scrubbing both sides of a wafer at the same time, that includes a brush box containment apparatus for use with highly-acidic or other volatile chemical solutions, a roller positioning apparatus and a (brush) placement device.

8 Claims, 25 Drawing Sheets

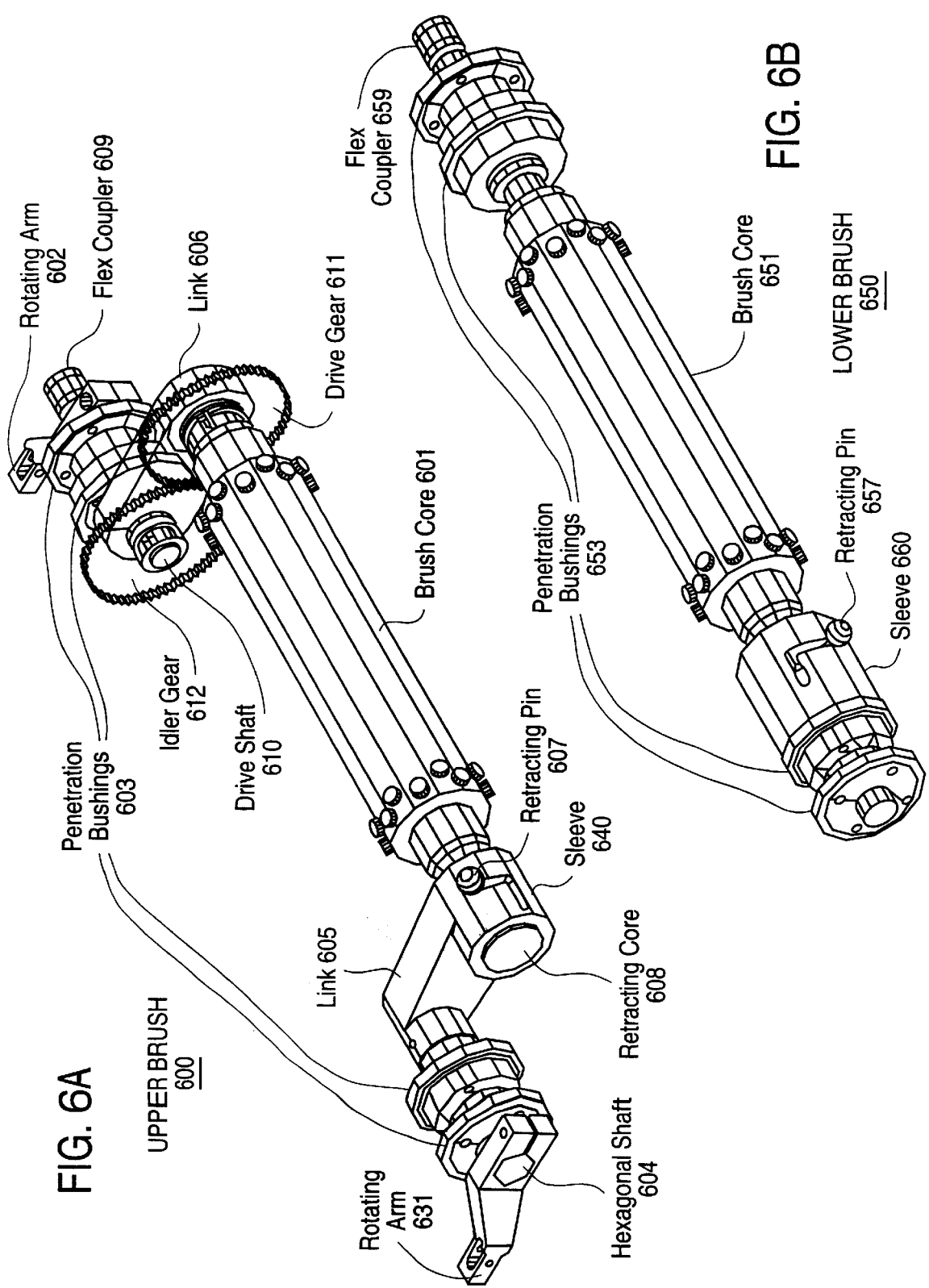

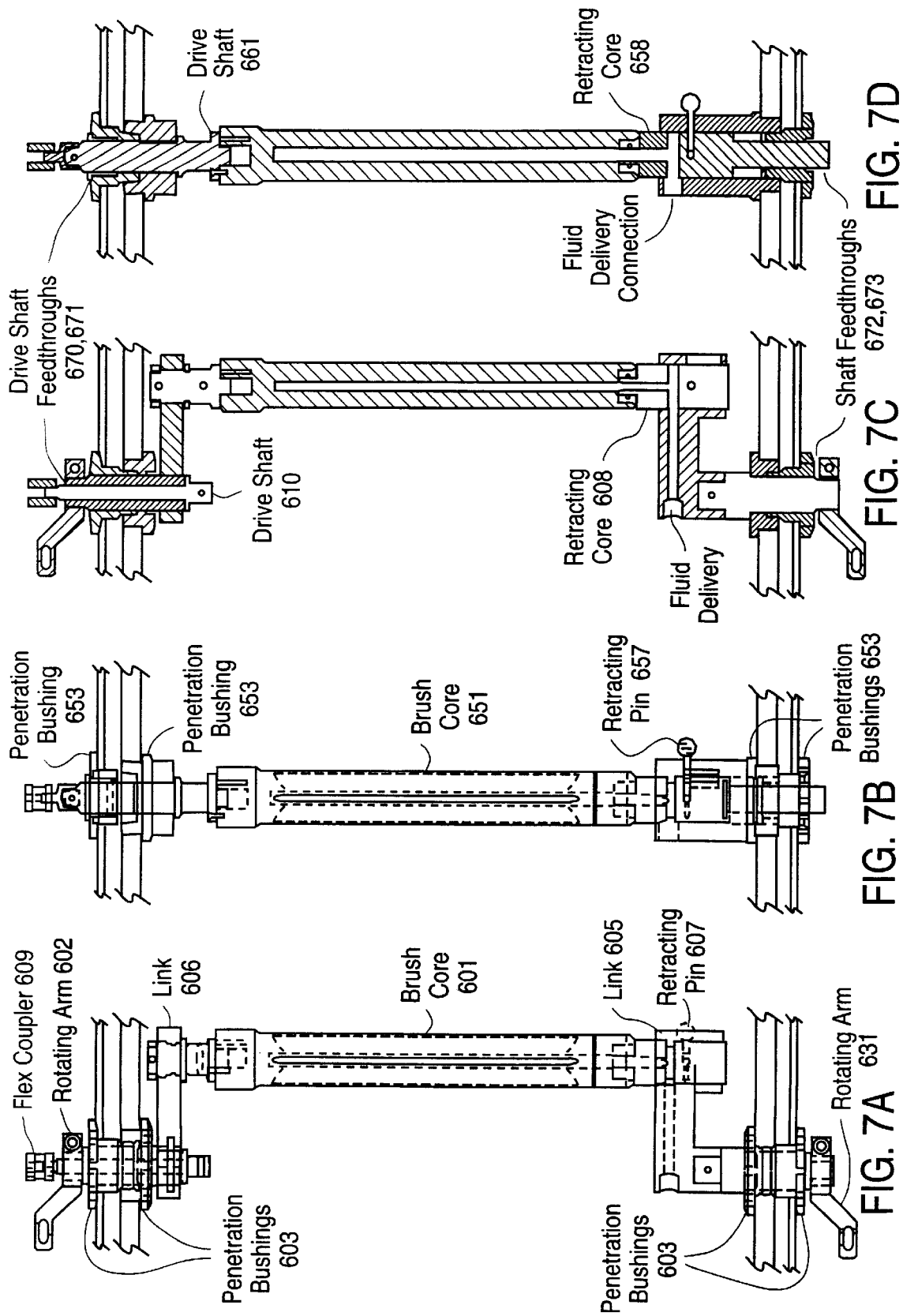

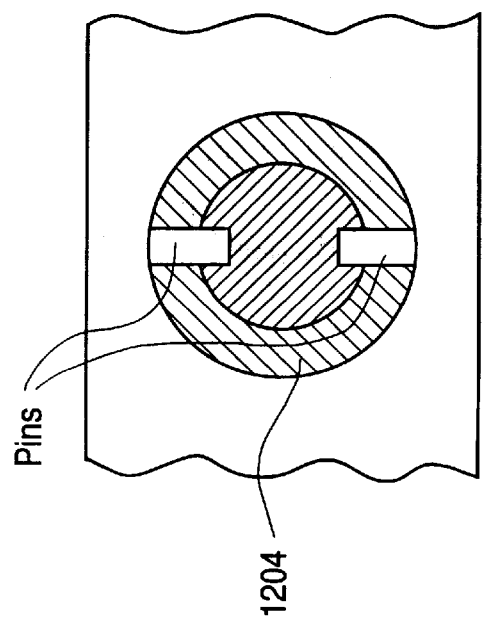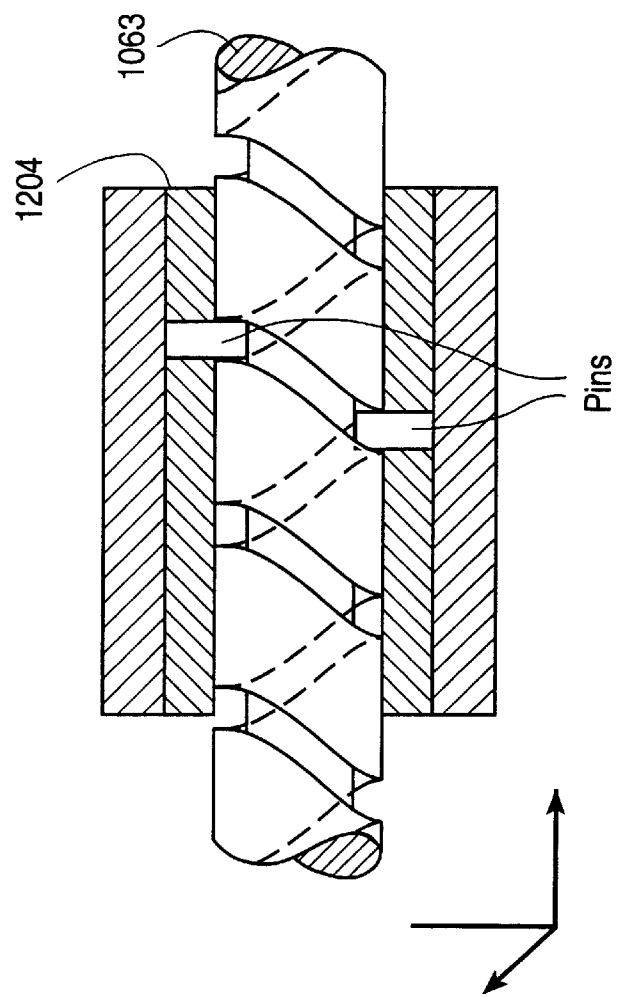
FIG. 12B

BRUSH BOX CONTAINMENT APPARATUS

This is a Continuation application of prior application Ser. No. 09/285,356 filed on Apr. 2, 1999, now U.S. Pat. No. 6,119,295.

FIELD OF THE INVENTION

The present invention relates to semiconductor wafer processing; particularly, the present invention relates to an apparatus for use in cleaning semiconductor wafers.

BACKGROUND OF THE INVENTION

In the manufacture of semiconductor devices, the surface of semiconductor wafers must be cleaned of wafer contaminants. If not removed, wafer contaminants may effect device performance characteristics and may cause device failure to occur at faster rates than usual.

One system used to remove wafer contaminants is commonly referred to as a scrubber. In at least one type of scrubber, semiconductor wafers are scrubbed simultaneously on both sides by a pair of brushes. While the wafer is being scrubbed simultaneously on both sides, the wafer is held in place and rotated so that the entire surface of the wafer is cleaned.

A wet processing system such as the scrubber described above comprises several distinct stations or modules. Each module is typically enclosed in a box-like structure which comprises the appropriate processing apparatus for that station For example, a scrubber may comprise a load or send station, one or more scrub stations, a spin rinse and spin dry station, and an output station.

A load or send station typically comprises a platform for holding a cassette of wafers, an elevator for lowering and raising the cassette, and sensors for sensing the presence of a wafer. Additionally, the load station may comprise sprayers to spray the wafers with filtered, deionized water (D.I. water) to keep them wet while they await processing. This is necessary where the previous operation, such as chemical mechanical polishing, leaves wet contamination (e.g., a slurry mixture) on the wafers, which, if dried, would be virtually impossible to remove.

A scrub station typically comprises one or more brushes, wheels (e.g., rollers) which grip and turn the wafer by its side during scrubbing and sprays or nozzles for dispensing chemicals.

A spin station typically comprises a nozzle for a final water rinse, a spinner for spin drying, and a lamp to provide heat assisted drying. A spin station may also comprise a nitrogen blowoff in addition to, or in place of, the heat lamp to assist drying. The spin station may also be used for a secondary or post cleaning process, such as a megasonic cleaning.

Finally, an output station comprises a platform for holding a cassette of cleaned and dried wafers. Additionally, one or more types of wafer transport mechanisms, such as rollers, belt conveyors, robotic arms, etc., are provided to transfer wafers within and between the stations.

During a cleaning process, the wafer lies flat on a wafer transport mechanism such as a conveyor mechanism, which moves the wafer into the brushes. While being scrubbed, the wafer is supported (or held horizontally, by the wafer transport mechanism, brushes, rollers, or a combination thereof. In one prior art type of scubber, as a wafer is being scrubbed by brushes, at least one roller rotates the wafer so that the surface may be cleaned. The roller may include an abrasive material to clean the edge/bevel area of the area of the wafer while it rotates. The roller itself is being rotated about its central access by a motor. The rotary motion of the roller is transferred to the wafer when the edge of the roller comes into contact with the outer edge of the wafer.

In one prior art system, the rollers are positioned using swing arms, which when rotated, cause the rollers to make contact with the wafer. Because the swing arms rotate, the brush box must be large enough in size to allow for the movement. However, it is desirable to provide more accurate control of the swing arms. That is, what is needed is a way to position rollers more accurately.

While systems have been developed to perform various wet processing operations, many drawbacks exist in prior art systems. For example, in wet processing systems that use highly acidic chemicals (e.g., HF), any exposure by drippage or fume exhaust may be harmful to the operator. Such contact with the chemicals may occur when maintenance or repair to the system is performed. Where the fear of contamination exist, it is desirable to minimize the potential exposure. Also, in prior art processing systems using such highly acidic and dangerous materials, there were little or no backup systems to compensate for leaks. Therefore, if a leak occurs, an immediate shut down of the system is the only solution. However, by the time such a shutdown is recognized as necessary, contamination may have already occurred.

Furthermore, in wet processing systems, contamination may also occur due to build up on the inside of the station walls. As chemicals in the brush stations and other stations dry, flaking may occur which increases the level of contamination and may cause damage to the system. Thus, it is desirable to reduce the build-up that occurs on the station walls.

The present invention provides for an improved wafer processing system which may be used for highly-acidic processes. In such processes, the system of the present invention include features which provide increased safety. The processing system reduces or even minimizes build-up on walls of the processing system that may cause flaking and contamination. In one embodiment, the system of the present invention also allows the rollers to be positioned without swing arms.

SUMMARY OF THE INVENTION

A brush assembly apparatus is described in one embodiment, the brush assembly apparatus includes a brush, a first rotatable shaft, a first drive mechanism, and a first arm. The member is coupled to the substrate manipulation device and rotatably coupled to the support system. The shaft is rotatably coupled to the support structure. The support structure moves along the shaft as the shaft rotates in order to position the substrate manipulation device.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

FIG. 6A illustrates a perspective view of one embodiment of the upper brush assembly of the present invention.

FIG. 6B illustrates a perspective view of one embodiment of the lower brush assembly of the present invention.

FIGS. 7A–7D illustrate a top views of embodiments of the upper and lower brush assemblies and section views of the upper and lower brush assemblies respectively.

FIG. 12B illustrates an alternative embodiment of the threading for the tractor assembly of the present invention.

DETAILED DESCRIPTION OF THE PRESENT INVENTION

Figure 1:
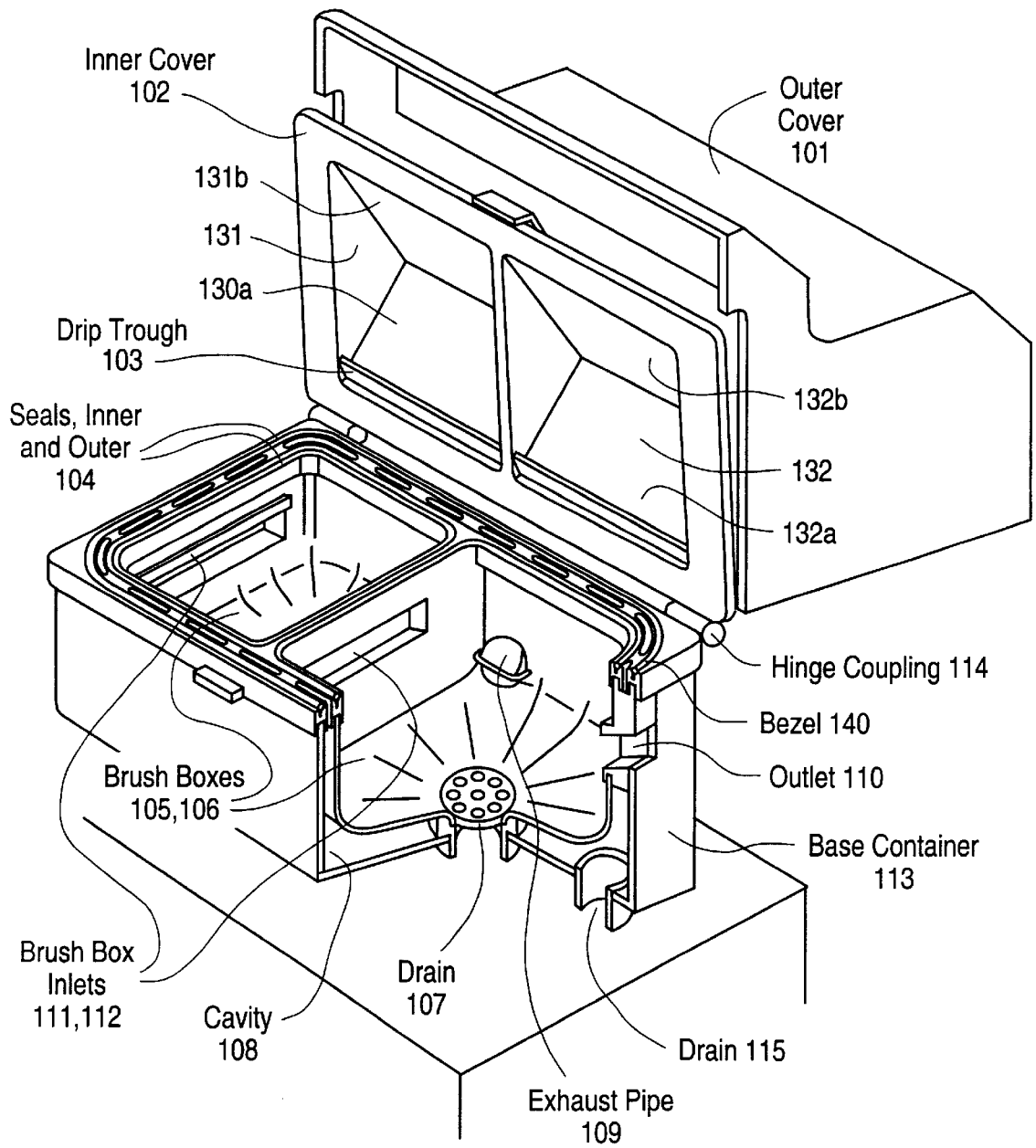
FIG. 1 illustrates one embodiment of a brush box containment apparatus of the present invention.

A brush assembly apparatus is described. In the following description, numerous details are set forth, such as component materials, etc. It will be apparent, however, to one skilled in the art, that the present invention may be practiced without these specific details. In other instances, well-known structures and devices are shown in block diagram form, rather than in detail, in order to avoid obscuring the present invention.

Overview of the Present Invention

The present invention provides a brush box containment apparatus that contains at least one brush box. Each brush box of the present invention comprises a brush assembly and a positioning assembly. The brush assembly comprises a pair of brushes for cleaning wafers and a mechanism to control and drive the brushes.

The positioning assembly of the present invention may be used to position various components and devices in a processing system. In one embodiment, such components include substrate handling and manipulation devices, such as rollers, wheels, guides, one or more robots. Each of the devices is coupled to a member or shaft (e.g., roller shaft), which is rotatably coupled to a support structure (e.g., tractor). The support structure operates as an attachment mechanism for rotatably coupling to a rotating shaft. When the shaft rotates, the support structure moves along the shaft to position the substrate handling/manipulation device. In one embodiment, the positioning apparatus comprises a roller positioning apparatus. The roller positioning apparatus comprises one or more rollers coupled to drive shafts that move the rollers in place and impart rotation motion to the rollers.

The brush box of the present invention may be incorporated into a substrate processing system having multiple processing stations. For instance, the substrate processing system may comprise a substrate scrubbing system having one or more brush stations for cleaning substrates. Although the present invention is described in conjunction with scrubbing a wafer, it will be appreciated that any similarly shaped, i.e. generally applied substrate, may be processed by the present invention. Further, it will be appreciated that reference to a wafer or substrate may include a bare or pure semiconductor substrate with or without doping, a semiconductor substrate with epitaxial layers, a semiconductor substrate incorporating one or more device layers at any stage of processing, or other types of substrates incorporating one or more semiconductor layers such as substrates having semiconductor-on-insulator (SOI) devices or substrates for processing other apparatuses and devices, such as flat panel displays, hard disks, multichip modules, etc.

In one embodiment, the present invention provides an acidic (high PH) cleaning process for wafers. The cleaning process may comprise an HF cleaning process. In order to withstand the corrosive effects of the acid, plastic components in the system may be comprised of such materials such as PET, acetal (DELRIN), teflon, polypropylene (polypro), polyuerethane, etc., and metal components may comprise stainless steel, such as Hastelloy $C_{276}$. Note that the present invention may be applied to other cleaning processes and systems.

The Brush Box Containment Apparatus

FIG. 1 illustrates one embodiment of a brush box containment apparatus of the present invention. Referring to FIG. 1, the brush box containment apparatus includes two brush boxes, brush boxes 105 and 106, which are coupled to and contained within base container 113 to form a double-walled chamber. Each of brush boxes 105 and 106 are coupled to the base container 113 such that a cavity, cavity 108, is formed therebetween. In one embodiment, a bezel 140 is coupled to brush boxes 105 and 106 to base container 113 which acts as an outer box. In one embodiment, bezel 140 joins boxes 105 and 106 and is made of a material that can withstand the chemicals in the process.

Each of brush boxes 105 and 106 comprise machined (or molded) inserts having rounded or smoothed corners or joints with large radii. In one embodiment, the radii are one-half inch or larger at the junction of the bottom of the brush box and the sides to help prevent collection and build-up on the side walls. This results in the wafers being exposed to less contamination In one embodiment, each of the brush boxes is made of polypropylene. Note that in an HF-based leaning system, it may be advantageous to flush the brush boxes for a period of time before use (e.g., 5 minutes).

In one embodiment, inner cover 102 includes two separate inclined sections 131 and 132. In one embodiment, these inclined sections include two portions which are molded together at approximately a 90° angle, where each portion extends upward from the bottom of the inner cover 102 at an angle of approximately 45° (when the lid is in the closed position). In an alternative embodiment, the two portions are molded together at an angle of approximately 80°. By being inclined at this angle, chemical solutions adhere to the inner cover 102 and don't drip off when the lid is opened. Instead, the chemical solutions slide down and collect in the drip trough 103 described below.

Inner cover 102 and outer cover 101 form a lid assembly for the brush box containment apparatus. In one embodiment, inner cover 102 includes a drip trough 103 that collects cleaning solutions that remain in contact with the inner cover 102 when the lid is in the open position. Note that the drip trough 103 is at approximately a 90° angle with respect to the inclined portion. In one embodiment, inner cover 102 and outer cover 101 comprise pressure formed acrylic. In another embodiment, the covers could be made of PETG, clear polypropylene, PVC, or any plastic that is compatible with the chemicals in the process.

The inner cover 102 and outer cover 101 are coupled together using a series of bolts. In one embodiment, a gasket or seal may be used in between the two. The bolts may be threaded. The covers may be coupled with screws, lock fasteners, or any other fastening device.

The lid assembly comprised of outer cover 101 and inner cover 102 moves between an open and closed position using hinge coupling 114. In one embodiment, the hinge coupling 114 comprises one or more hinges coupled between base container 113 and the lid assembly. A description of one embodiment of hinge coupling 114 and a drive that controls the opening and closing of the lid assembly are described in further detail below.

Each of the brush boxes 105 and 106 includes at least one inner chamber drain, such as inner chamber drain 107 of brush box 106, and an exhaust pipe, such as exhaust pipe 109 of brush box 106. In one embodiment, the inner chamber drains comprise two inch drains with three or four inch dual containment In one embodiment, the drains are made of P.V.A. Also, in another embodiment, the drains are comprised of polypropylene. The drains may be made of any material that withstands the corrosive effects of high PH acid-based processes. One or more additional drains, such as outer chamber drain 115, may provide for additional drainage out of base container 113. In other processing stations like the spin and input stations, the drains may comprise P.V.C.

In one embodiment, drain 115 includes a leak detection system that detects leaks from either brush boxes 105 or 106. The use of drains in cleaning and other processing systems is well-known in the art.

In one embodiment, each of the exhaust pipes 109 comprises a two inch exhaust on the back side of each box that is tied to an exhaust regulator (not shown to avoid obscuring the invention). In one embodiment, the exhaust regulator controls the flow using a valve from a constant source such that the flow changes depending on whether the lid assembly is closed or open. If the lid is closed, the exhaust regulator controls the valve such that the flow is approximately 5 to 10 SCFM, while if the lid is open the exhaust regulator controls the valve such that the flow is approximately 60 SCFMs. Note that the flow rate of the exhaust regulator may be dictated by safety constraints. The use of the exhaust protects the operator from fumes (e.g., HF, ammonia ($NH_4OH$)) and allows clean room air to be brought into the brush boxes 105 and 106 from the clean room environment when the lid assembly is open. The use of exhaust pipes and exhaust regulators is well-known in the art.

Brush boxes 105 and 106 are also coupled to inner and outer seals 104. In one embodiment inner and outer seals 104 comprise elastomer or other foam-type seals, which are well-known in the art.

The brush box containment apparatus includes brush box inlets 111 and 112 to permit entry of wafers into each of the individual brush boxes 105 and 106 respectively. Note that the inlet 112 to brush box 106 is coupled to the outlet of brush box 105. Brush box 106 also includes outlet 110 by which wafers exit the brush boxes of the containment apparatus after cleaning.

The wafers move between the brush boxes and between the different stations of the processing system using wafer transport mechanisms, such as rollers, belt conveyors, robotic arms, etc., which are well-known in the art. These wafer sport mechanisms have not been shown here to avoid obscuring the present invention.

Figure 2:
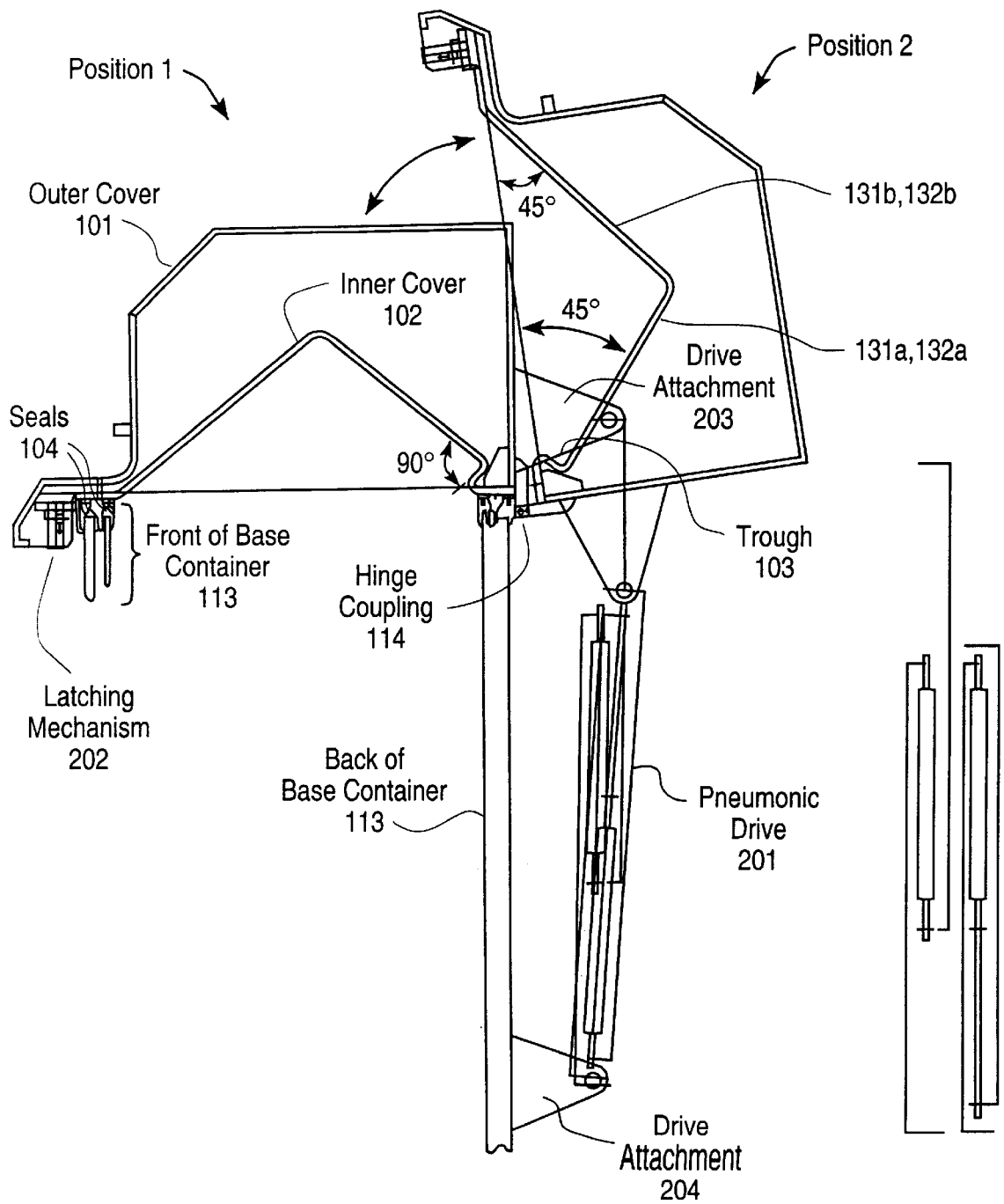
FIG. 2 illustrates one embodiment of a lid assembly of the brush box containment apparatus and a control system to move the lid assembly between open and closed positions.

FIG. 2 illustrates one embodiment of a drive system to move the lid assembly between different positions. Referring to FIG. 2, position 1 is the closed position in which the lid assembly, comprised of outer cover 101 and inner cover 102, is in a substantially vertical position with respect to the back of base container 113 and in which inner cover 102 is in contact with seals 104 at the front of base container 113. In one embodiment, while in the closed position, the lid assembly forms a double-humped seal with the base container 113. The seal between inner cover 102 and the front of base container 113 undergoes compression. In one embodiment, the seal undergoes approximately ⅛ of an inch of compression. In one embodiment, the seals comprise foam seals. The foam seal may be attached to a cover. At position 2, the open position, the lid assembly is pivoted up. Note that any solutions or fluids in contact with the inner cover 102 are collected by trough 103 when the lid assembly is fully opened.

A latching mechanism 202 is shown which latches the outer cover 101 to the base container 113 when the lid assembly is in the closed position.

A pneumatic drive 201 coupled to outer cover 101 via drive attachment 203 and to the back of base container 113 via drive attachment 204 controls the movement of the lid between the open (position 2) and closed (position 1) positions. Drive attachments 203 and 204 comprise brackets and will be well-known to those skilled in the art. Pneumatic drives are also well-known in the art.

Sensors may be used to indicate when the lid assembly is in the open or closed positions. Such sensors may be incorporated into the pneumatic drive 201, the hinge coupling 114, the base container 113, or the latching mechanism 202. The use of such sensors is well-known in the art.

Figure 3:
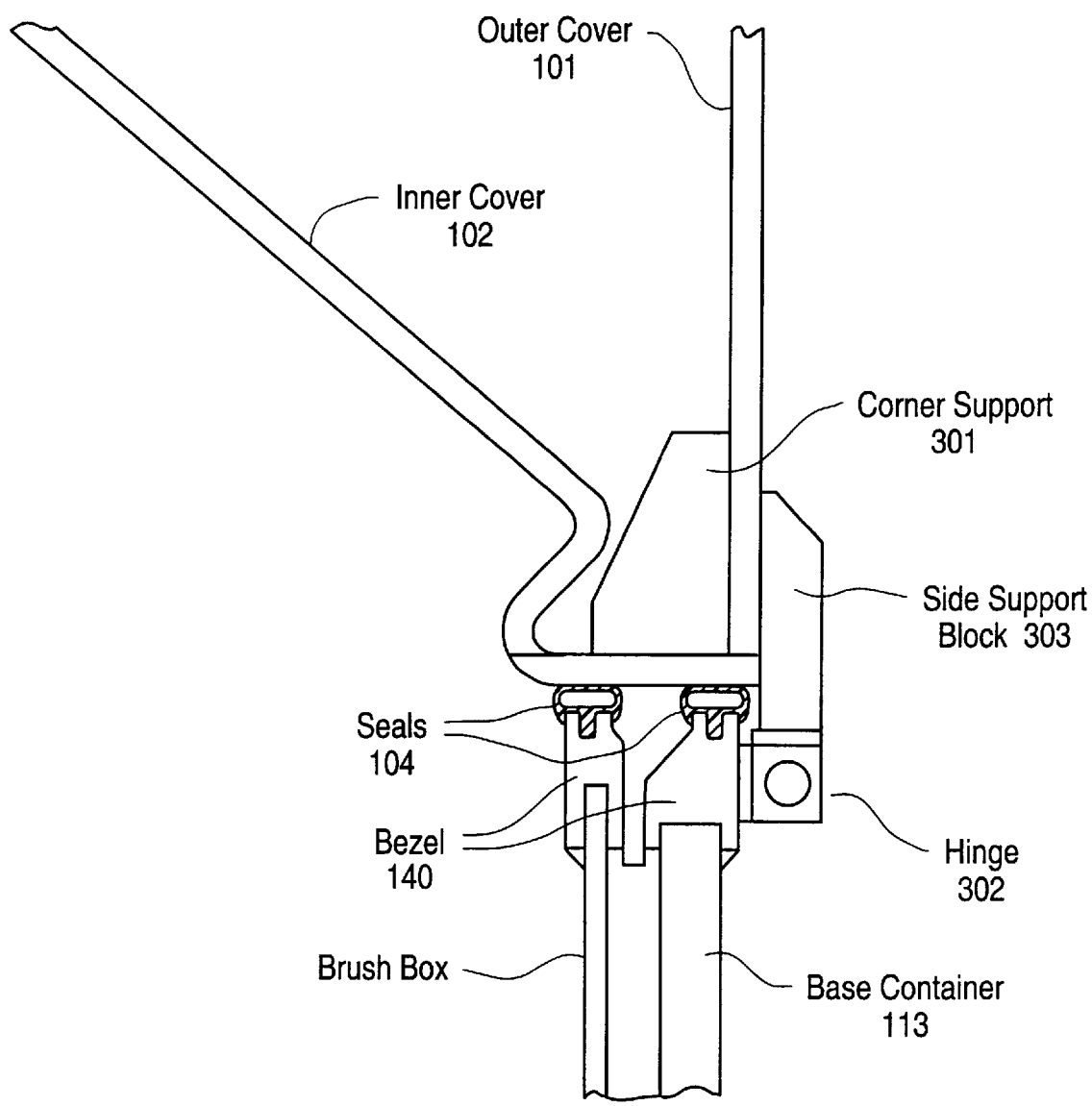
FIG. 3 illustrates one embodiment of the hinge coupling for attaching the lid assembly to the base container of the brush box containment apparatus.

FIG. 3 illustrates one embodiment of the hinge coupling 114. Referring to FIG. 3, a corner support 301 is coupled between outer cover 101 and inner cover 102 In one embodiment, corner support 301 is coupled to outer cover 101 and inner cover 102 via screws. In one embodiment, corner support 301 comprises clear acrylic solvent cemented to the covers. Also coupled to outer cover 101 is side support block 303. The side support block 303 helps distribute the load from the lid and the lid's motion In one embodiment, side support block 303 comprises a black acetal block. A hinge 302 is coupled to side support block 303 and to bezel 140. In one embodiment, hinge 302 is coupled to side support block 303 and bezel 140 via screws.

Although one embodiment of the hinge coupling 114, it would be apparent to one skilled in the art that numerous hinging or coupling mechanisms for rotatably coupling the lid assembly to the base container 113 may be used.

Figure 4A:
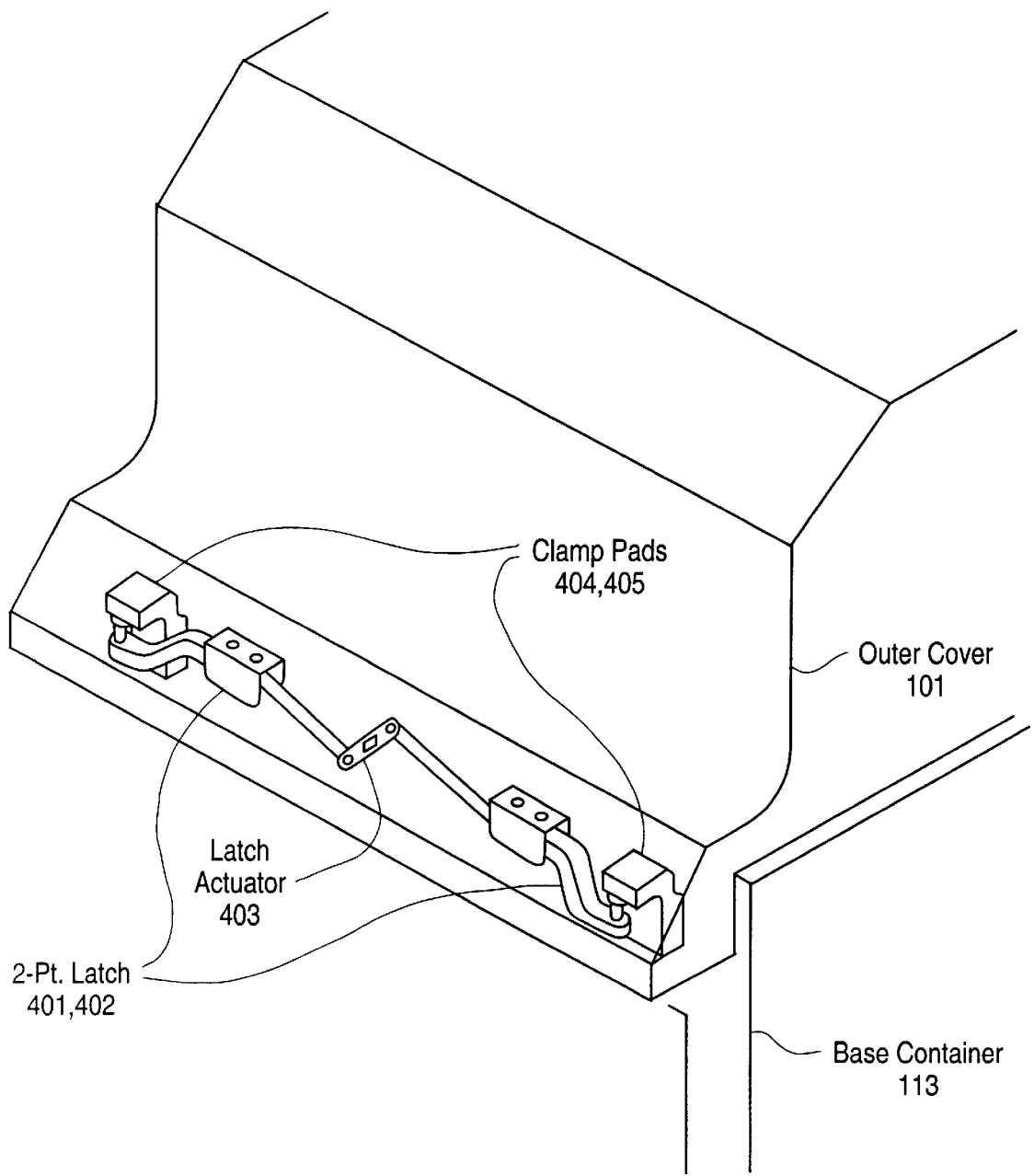
FIG. 4A illustrates one embodiment of a latching mechanism for the lid assembly of the present invention.

FIG. 4A illustrates one embodiment of the latching mechanism used to latch the lid assembly to base container 113. Referring to FIG. 4A, 2-point latches 401 and 402 are coupled beneath outer cover 101. Clamp pads 404 and 405 are coupled to base container 113. Latch actuator 403 is coupled beneath outer cover 101 and to the 2-point latches 401 and 402. As latch actuator 403 is turned, the latches 401 and 402 extend beneath the damp pads 404 and 405, thereby locking the lid assembly to the clamp pads 404 and 405. Such mechanical movement is well-known in the art. Latch actuator 403 may include an external accessible knob or switch to allow the latch actuator 403 to be manipulated by the operator. Note that many other latching mechanisms which are well-known in the art may be incorporated into lid assembly and base container 113 to ensure secure and tight closure between the lid assembly and base container 113. For instance, outside latches may be used at specific locations on the outer cover 101 (e.g., at the comers) to secure the lid assembly to the base container 113.

Figure 4B:
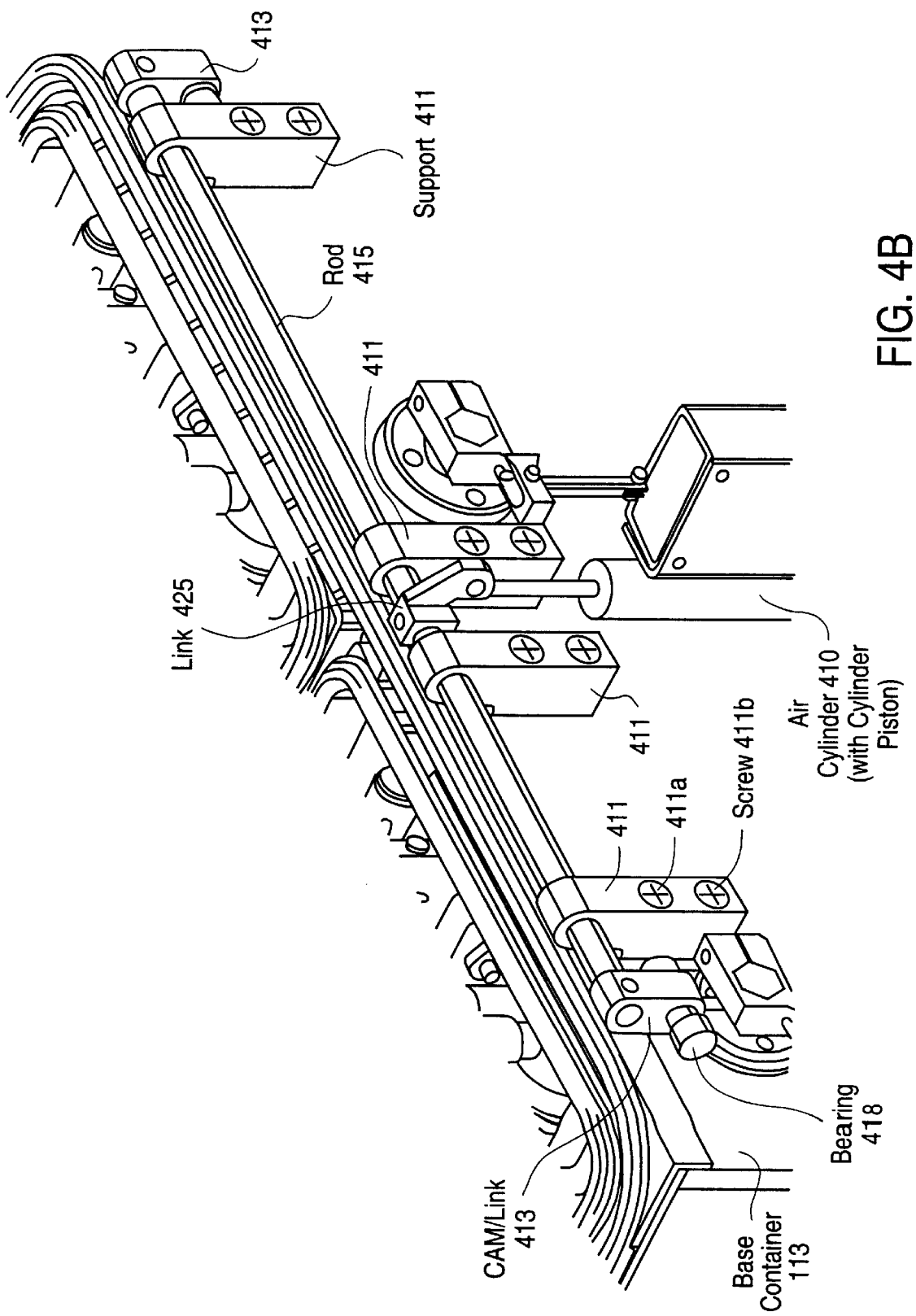
FIG. 4B illustrates another embodiment of a latching mechanism for the lid assembly of the present invention.

Note that any non-by passable lock may be used. FIG. 4B illustrates another embodiment of the latching mechanism. Referring to FIG. 4B, the latching mechanism comprises the following elements: air cylinder 410, supports 411, screws 411a/411b, cam/links 413, rod 415, bearing 418 and link 425.

Air cylinder 410, in conjunction with link 425 cause rod 415, which is coupled to the base container 113 by supports 411, to rotate. The rotation of rod 415 causes the cams 413 coupled to each end of rod 415 to rotate. As the cams 413 rotate down, they engage a lip on the cover, thereby securing closure. Rotating the cams upward, releases the cover.

Figure 5:
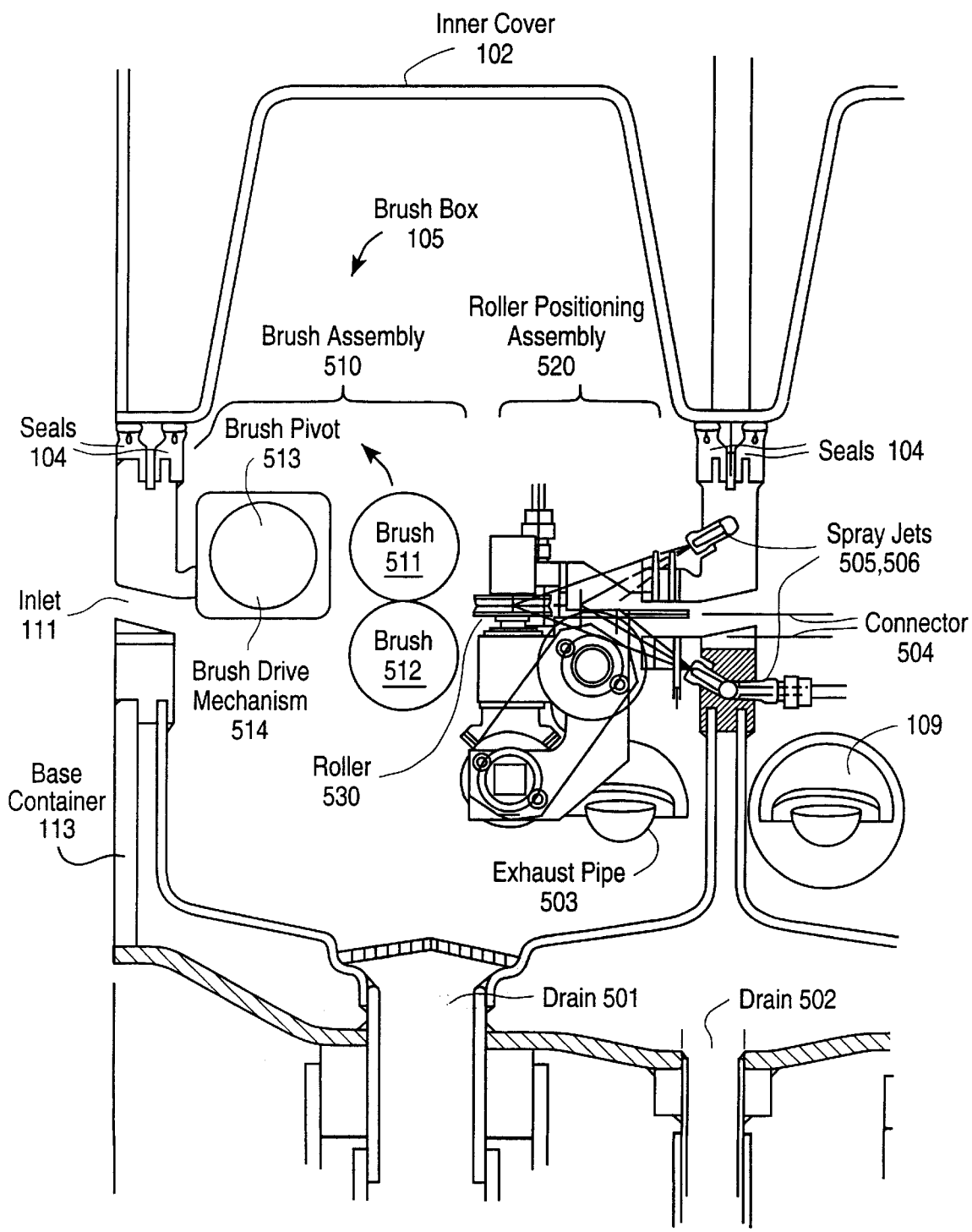
FIG. 5 illustrates a side view of one embodiment of a brush box and a portion of the brush box containment apparatus.

FIG. 5 illustrates a side view of brush box 105. Note the brush box 106 is substantially similar. Referring to FIG. 5, brush box 105 is shown to contain a brush assembly 510 comprising scrubbing brushes 511 and 512 for scrubbing both sides of a wafer at the same time and a brush drive mechanism 514 with a brush pivot point 513, as are described in more detail below. The brush drive mechanism 514 is coupled to drive brush 511 and is described in greater detail below.

Note that brush box 105 also includes inner chamber drain 501. Also shown is outer chamber drain 502 which corresponds to a drain in base container 113. Brush box 105 also includes an exhaust pipe 503 as described above. All drains include seals, which are well-known in the art. Each seal may include a leak detection apparatus. In one embodiment, the outer chamber drain 502 is comprised of polypro.

Brush box 105 also includes inlet 111. Inlet 111 allows passage of wafers to its interior. Brush box 105 is also shown incorporating spray jets 505 and 506 to spray cleaning solutions onto the rollers, such as roller 530 and onto wafers as they exit brush box 105. In one embodiment, spray jets 505, 506 are mounted at the entrance and exit of brush box 105 and at the exit of brush box 106. In an alternative embodiment, spray jets 505, 506 could be mounted at the entrance of brush box 106. The use of spray heads and jets are well-known in the art.

Brush box 105 also contains roller positioning assembly 520 which positions rollers, such as a roller 530, with respect to the wafer that is being cleaned between brushes 511 and 512 Embodiments of the roller positioning assembly 520 will be discussed in detail below.

It should be noted, as shown in FIG. 5, there are no penetrations apart from exhaust and drains through the bottom of the chamber. The penetrations through the chamber are at the sides. By having only side penetrations, less seals are required and the potential for leaks is reduced, which is particularly advantageous in systems employing highly-addic chemicals.

Brush Assembly

FIGS. 6A and 6B illustrates perspective views of the upper brush assembly 600 and the lower brush assembly 650 respectively of the brush assembly 510 (shown in FIG. 5). FIGS. 7A–7D illustrate a top view of the upper and lower brush assemblies and a section view of the upper and lower brush assemblies respectively. It should be noted that the actual brushes themselves (apart from the drive mechanism) are well-known in the art. Each brush includes multiple protrusions (not shown) to facilitate the cleaning of wafers. In one embodiment, the upper and lower brushes are configured to provide fluid to the core of the brush to be dispersed to the outside of the brush through the brush surface. Such brushes and fluid delivery system will not be described in detail herein. For descriptions on exemplary brushes and more information on the system for fluid delivery through the brush, see U.S. Pat. application Ser. No. 08/542,531 entitled "Method and Apparatus for Chemical Delivery Through the Brush" filed Oct. 13, 1995, now abandoned, and is assigned to the corporate assignee of the present invention.

Referring to FIGS. 6A, 7A, and 7C, one embodiment of the upper brush 600 is described. Rotating arms 631 and 602 are coupled to and responsive to an upper brush lift drive (one on each side of the brush box) to cause the upper brush assembly 600 to be pivoted towards and away from the wafer. The pivot point about which the upper brush core 601 is rotated is centered upon the axis of rotation of drive shaft 610. The amount of pivot towards the wafer affects the amount of pressure applied to the wafer and is a design choice based on the requests of the cleaning process. Note that this pivot motion is internal to the brush box. During the pivoting operation, the lower brush assembly 650 is stationary (due to its attachment to the brush box and containment walls).

Rotating arm 631 is coupled to upper brash core 601 through the use of a hexagonal shaft, such as hexagonal shaft 604, and link 605. Rotating arm 602 is coupled to the upper brush core 601 through link 606. Rotating arm 602 coaxially rotates about the drive shaft such that rotation of the drive shaft 610 does not cause pivoting of the upper brush As shown, the rotating arm 602 is coupled to drive shaft feed through 670 that is rotatable itself. In one embodiment, each lift drive comprises a stepper motor (not shown to avoid obscuring the present invention) and operates by pushing up on the end of rotating arms 631 and 602, thereby causing the upper brush core 601 to pivot downwards to the top of a wafer during the cleaning process. When the each drive pulls down, rotating arms 631 and 602 cause upper brush core 601 to pivot away from the wafer. In an alternative embodiment, lift levers may be employed to move upper brush core 601 to and from the wafer surface. Also, by coupling the stepper motor above the rotating arms, the pivoting of the upper brush assembly 600 may be performed except with control exerted in opposite directions.

Figure 15:
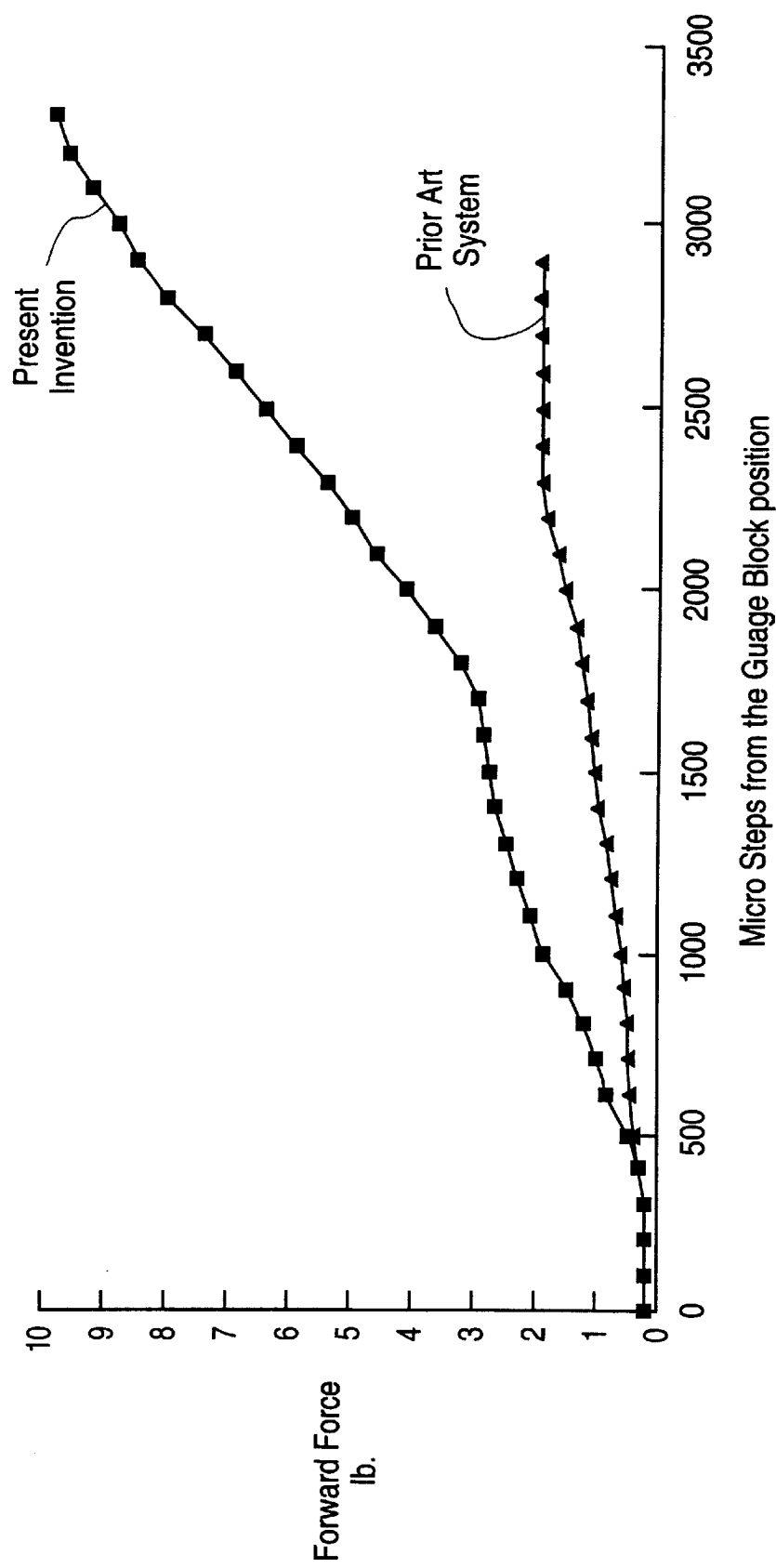
FIG. 15 is a graph illustrating the pressure that the brush may apply to the wafer.

The brush positioning apparatus that causes the brush core 601 to be applied to the wafer may be controlled to apply the brush core 601 to the wafer at various pressures. In other words, the brushes are physically attached so that they may be physically moved (pushed down), as opposed to gravity based movement of the prior art. By pushing up on the end of the rotating arms 631 and 602 with greater force from the stepper motor, the brush core 601 is applied to the wafer with increased pressure. The increase in pressure is because of the mechanical ratios. FIG. 15 is a graph illustrating the pressure at which a brush core is applied to an 8" wafer using a stepper motor when positioning a brush core in a prior art system and in the present invention. The microsteps of the present invention produce greater brush movement than in the prior art. As illustrated, the amount of pressure that may be applied is greater than that of the prior art, even 4–5 times greater. The increased pressure applied by the present invention allows removal of embedded particles on the wafer during scrubbing. Using the HF-based process, in conjunction with the increased pressure, provides an overall better cleaning process.

Also due to the greater pressures, the brush core 601 may be replaced and one or more buffing pads to allow buffing of wafers and substrates. In one embodiment, such a pad comprises a flat pad or rotating pad such as a suba IV or other polishing pad. When using a flat pad, the lower brush might not be necessary. In this case, the wafer must still be sorted. However, if both sides need to be buffed, then pads may be required on both sides.

Thus, the brush assembly of the present invention provides pressure suitable for a buffing system. Therefore, the present invention allows a processing system to be a dual buffing/cleaning system in which the first set of "brush" boxes (one or more) in the base container are used for buffing and the later brush boxes (one or more) are used for scrubbing wafers.

Figure 6C:
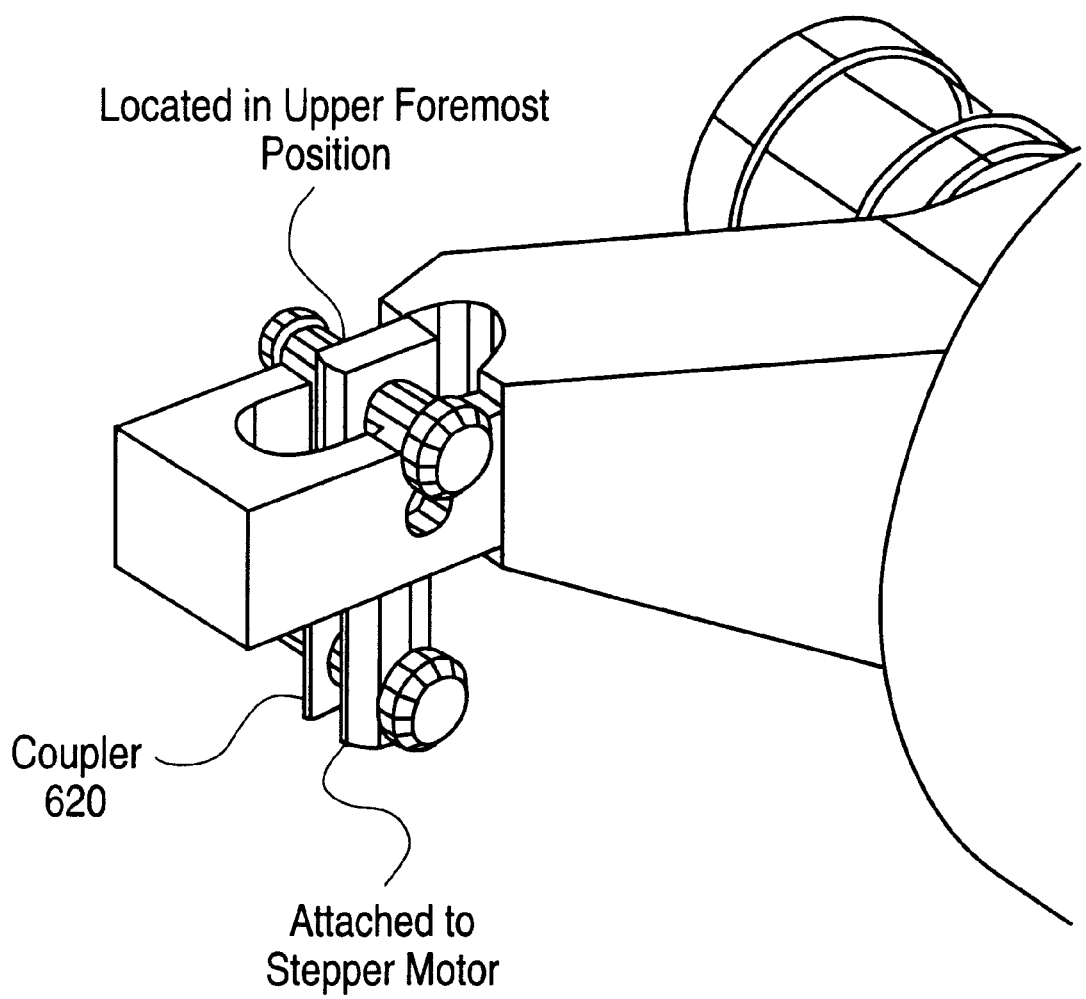
FIG. 6C illustrates one embodiment of a rotating arm and its coupling for attachment to a drive.

FIG. 6C illustrates one of the rotating arms 631 and 602 and its coupler 620 to a stepper drive, which is positioned for operation below the rotating arm. When the coupler 620 is in the upper most position, the brush core 601 is being applied to the wafer, while in the lower most position, the brush core 601 pivots away from the wafer. If the stepper motor is positioned above the rotating arm, the movement of the coupler 620 would be reversed to obtain the same brush core movement.

Sets of penetration bushings 603 are used to maintain the position of shaft feed throughs 670 and 672, and the upper brush assembly 600, with resect to the base container 113 and secure upper brush assembly 600 to side of the brush box. In this manner, the penetration bushings 603 are used as part of the coupling of the upper brush assembly 600 to the brush box and base container 113. Penetration bushings 603 also act as seals between the inner cavity of the brush box and the exterior of the base container 113 (see FIG. 1). The use of penetration bushings is well-known in the art In one embodiment, the penetration bushings are made of T-500, made by IGUS, Inc. of East Providence, R.I.

Separate links 605 and 606 are used to couple the drive section and rotating arms of upper brush assembly 600 to its brush core 601.

Flex coupler 609 is used to couple drive shaft 610 to a motor (not shown) that drives the upper brush core 601, causing it to rotate. In one embodiment, the flex coupler 609 is coupled to drive shaft 610 via a stainless steel (or other add resistant material) shaft reducer.

The rotation motion which the motor applies to drive shaft 610 is applied to the brush core 601 through a set of gears. (Note that shaft feed throughs for both the upper brush assembly 600 and the lower brush assembly 650 allow the drive shafts 610 and 660 to freely rotate in response to activation of their drive motors.) Idler gear 612 is coupled to drive shaft 610. Drive gear 611 is coupled to the brush core 601. Idler gear 612 and drive gear 611 contact each other through their teeth. When drive shaft 610 is rotated, idler gear 612 rotates. The rotation motion of idler gear 612 is then transferred to drive gear 611 in a manner well-known in the art. It should be noted that the size of the gear is a design choice. In one embodiment, idler gear 612 and drive gear 611 each have 66 teeth and have pitch of 24, and a diameter of 2.75 inches.

The size of the idler gear 612 and the drive gear 611 with respect to each other may be changed. This change in their ratio may be beneficial to give different differential speeds. Such different speeds may be important for edge clearing purposes with spin rollers. Also note that although gears are shown to drive upper brush assembly 600, gears may be replaced by belts.

In one embodiment, a gear guard is used to cover the gears to prevent particles from the cleaning process from getting into the gears and to prevent particles created by the gears from contaminating the wafers.

Figure 6D:
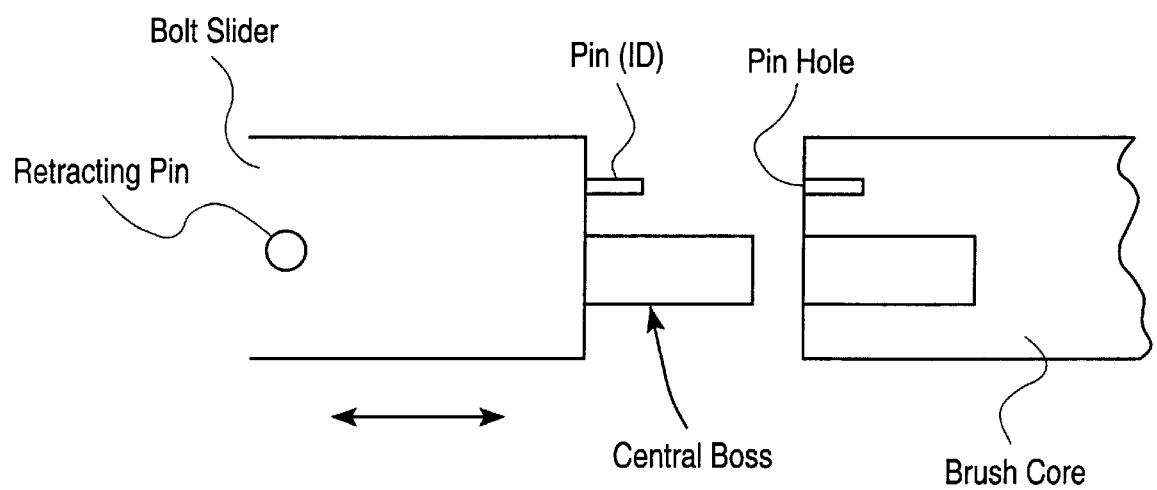
FIG. 6D illustrate one embodiment of a release mechanism of the present invention that includes a retracting core.

Retracting pin 607 is coupled to retracting core 608 near one end of the brush core 601. The present invention provides retracting pins 607 and retracting core 608 to allow for easy removal of the brush core 601. In this manner, the brush core 601 may be removed for maintenance and repair. When retracting pin 607 is moved downward and to the left from its position in FIG. 6A, the retracting core 608 which is partially disposed within the brush core 601 is pulled outside of brush core 601. The amount that retracting core 608 is pulled out from brush core 601 allows the brush core 601 to be freed from link 605. Such movement moves the other end of brush core 601 away from link 606, which extends to partially within brush core 601. Once at this position, the brush core 601 may be extracted from the brush box. FIG. 6D illustrates one embodiment of a release mechanism for brush removal.

Referring to FIG. 6D, a telescoping bolt slider is shown that includes a retracting pin, a center boss (gear bolt) and an ID pin. One end of the brush core, opposite from the drive mechanism, includes holes to receive both the center boss and the ID pin As shown in FIG. 6D, by moving the retracting pin to the right, the holes of the brush core receive the ID pin and the center boss. When the retracting pin is moved to the left, the center boss and ID pin disengage from the brush core. The center bolt slider slides within a sleeve, such as sleeve 640 or sleeve 660 of FIGS. 6A and 6B respectively. The sleeve includes a channel for the retracting pin to lock into place. The ID pin is required to allow the brush core to rotate because once the center boss is engaged and rotated, the only rotation would be within the brush core. In one embodiment, the ID pin is on the non-retractable end of the brush core. The center boss is for support and bearing for the end of the core. The rotation of the brushes loads the retracting pin to keep it in place.

The other end of the brush core is also coupled to a stationary core which extends into its end in the same manner as the bolt slides when engaged. By disengaging the bolt slider, the brush core may be moved manually, or by machine, off the stationary core by sliding the brush in the same direction as the bolt slider is moved while still being disengaged. Note that the stationary core may be no more than the drive shaft extending into the brush core. When enough clearance exists between the brush core and the retracting and stationary cores, the brush core may be pulled out of the brush box.

Referring back to FIGS. 6B, 7B and 7D, lower brush assembly 650 is similar to upper brush assembly 600, in that it includes a brush core 651 and a penetration bushings 653 to secure the lower brush assembly 650 to the brush box and base container 113. A flex coupler 659 is coupled to a drive shaft 661. The flex coupler 659 couples a drive motor to the drive drive shaft 661 the lower brush core 651.

Lower brush assembly 650 also includes a retracting pin 657, which operates similarly to retracting pin 607 by extracting a retracting core 658 from being disposed within brush core 651, thereby allowing brush core 651 to be removed from the brush box.

It should be noted that although lower brush assembly 650 is directly driven by a motor through flex coupler 659, in an alternative embodiment, the lower brush 650 may be driven by the same motor that drives the upper brush 600 through the use of gears. In one embodiment, four gears are used to drive the lower brush core with the same motor that drives the upper brush core. In such an embodiment, a drive gear coupled to the brush core would be driven by an idler gear 612 and/or drive shaft 610. Using only one motor reduces the number of penetrations into the brush box, which is advantageous in highly acidic cleaning processes as described above.

Figure 8A:
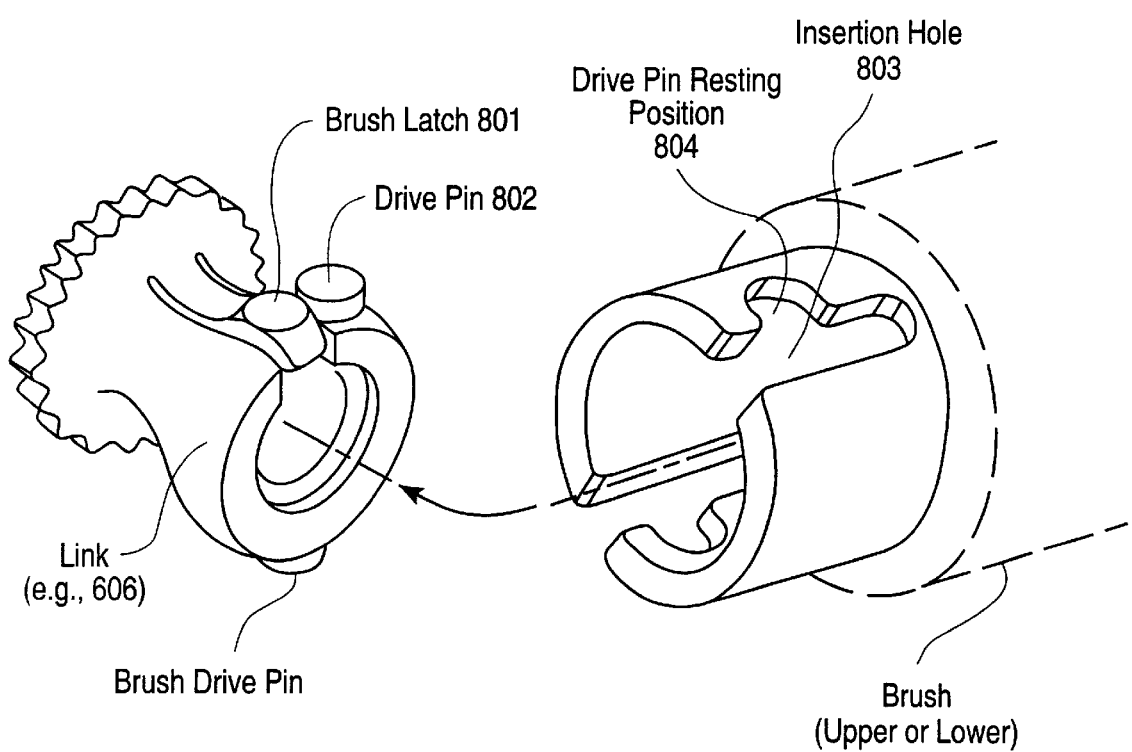
FIGS. 8A–8D illustrate alternative embodiments of a release mechanism for releasing a brush from its drive.

FIGS. 8A–8D illustrate alternative embodiments of the release mechanisms for releasing a brush core from the drive mechanism. Referring to FIG. 8A, attached to each link is a brush latch 801 and drive pin 802. A substantial identical drive pin is on the other side of link. The brush includes an extension having an insertion hole 803 which is adapted to receive the brush latch 801 and the drive pin 802. The brush latch 801 and drive pin 802 are attached to the brush core by pushing the drive pin 802 in the insertion hole 803 and twisting the brush, thereby causing the drive pin 802 to arrive at resting position 804 with the brush latch 801 following the drive pin into the insertion hole 803. Removal is in the opposite direction by first pushing this latch inward to dear the brush cylindrical housing and then twisting to allow the drive pin to disengage the brush through the insertion hole 803.

Figure 8B:
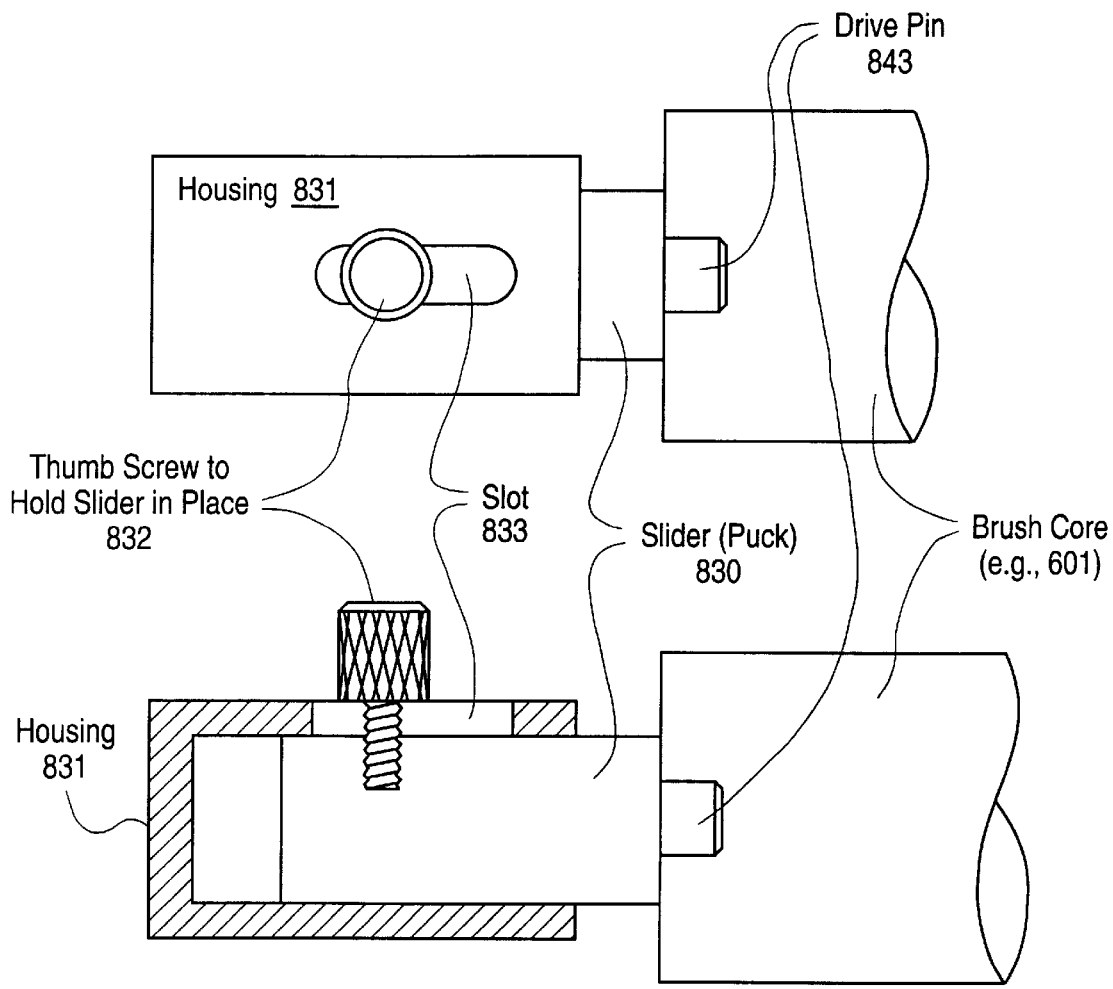

FIG. 8B illustrates two views of another embodiment for releasing a brush core from its drive mechanism. Referring to FIG. 8B, a slider (puck) 830 slides within housing 831. A screw, such as thumb screw 832, inserted through slot 833 holds slider 830 in place. By partially unscrewing thumb screw 832, the slider 830 may be moved by moving thumb screw 832 within slot 833.

Figure 8C:
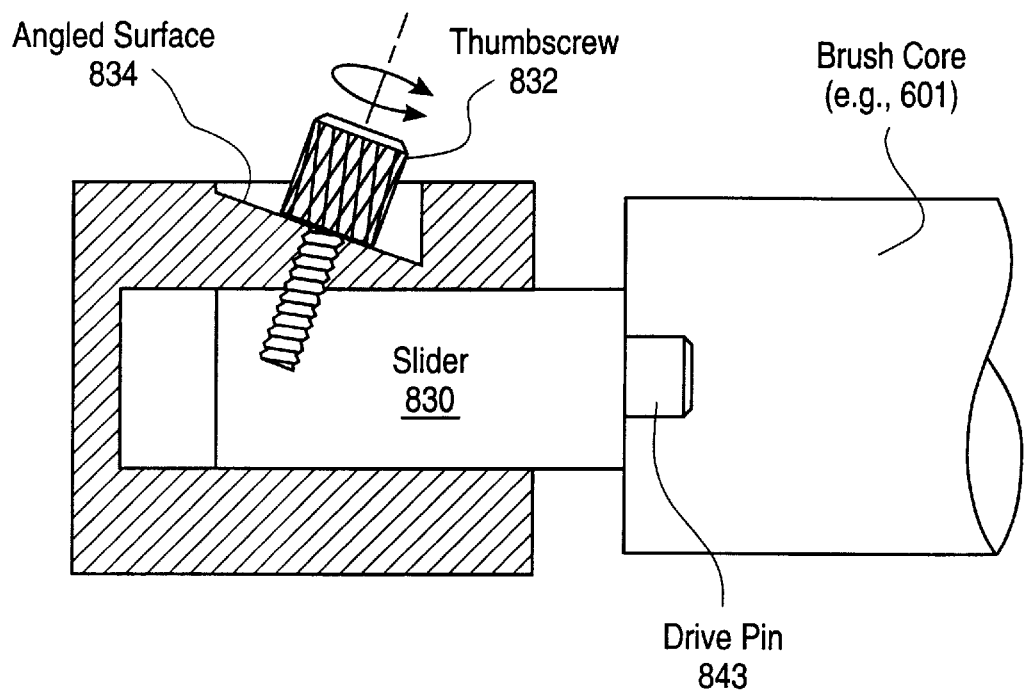

FIG. 8C illustrates a variation of the sliding puck concept of FIG. 8B. Referring to FIG. 8C, the thumb screw 832 is applied in an angled surface 834. The angle surface 834 prevents the slider 830 from sliding too fast or too far. This is caused from the material thickness change.

Figure 8D:
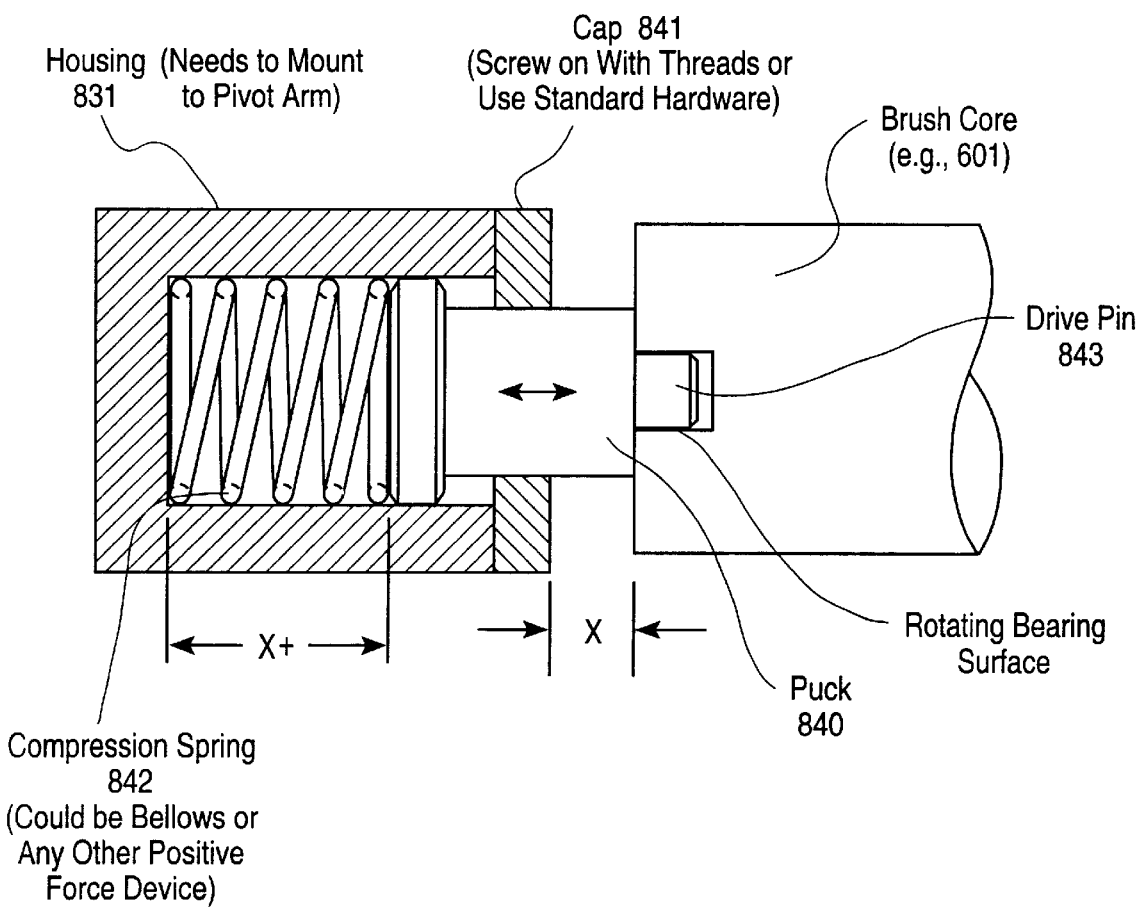

FIG. 8D illustrates a floating puck 840 which slides within a housing 831. The housing 831 mounts to a pivot arm. A cap 841 is coupled to the housing 831 to maintain the puck 840 within the housing 831. In one embodiment, the cap 841 screws on the housing 831 using threads. In another embodiment, the cap 841 is coupled to the housing 831 using standard hardware. A positive drive force, such as a compression spring 842, is coupled to the puck 840 to allow the puck 840 to be moved. The compression spring 842 allows the operator to slide the brush core back, forcing the puck 840 to collapse the spring 842. Collapsing the compression spring 842 frees the drive pin 843, allowing the brush core to be swung up and freed from the puck 840. The positive drive force may be any positive drive force, such as, for instance, a bellows.

In one embodiment, drive pin 843 is coupled to the brush core using a rotating bearing surface.

In an alternative embodiment, each brush core may be coupled in a spring-loaded fashion, such as a toilet-paper roller.

Roller Positioning Assembly

The present invention provides a roller positioning assembly that is used to position rollers on wafer device wheels in the brush box. Although the assembly is used for positioning rollers, it is equally applicable to position other types of wafer manipulation and handling devices and/or components hi processing blocks or boxes. Embodiments described below include positioning two rollers. It should be noted that the present invention has applications where only one such roller or one wafer or substrate handling/manipulation device is being positioned.

Figure 9A:
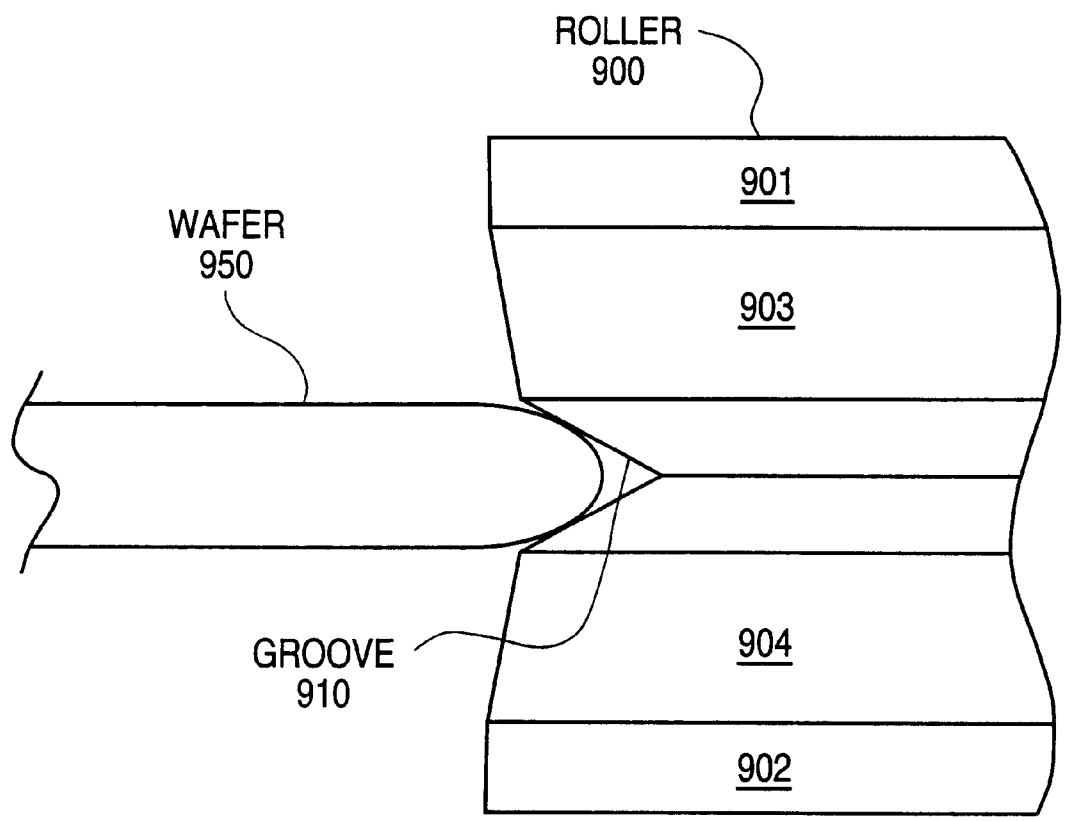
FIGS. 9A and 9B illustrate embodiments of the roller of the present invention.

One embodiment of the roller is shown in FIG. 9A. Referring to FIG. 9A, the roller 900 includes top and bottom surfaces 901 and 902 which are generally cylindrical, slightly conical portions 903 and 904 and inner groove 910. When a wafer, such as wafer 950, is being cleaned between brushes, it is pushed forward, inserted into the groove 910 of the roller 900 to a point where groove 910 pinches the wafer 950 causing increased contact, and therefore, increased friction between the roller 900 and the edge of the wafer 950. Therefore, when the roller 900 is rotated, the friction causes the wafer 950 to rotate. For information on the roller, see U.S. patent application Ser. No. 08/275,639, entitled "Hesitation Free Roller", filed Jul. 15, 1994, now abandoned, and assigned to the corporate assignee of the present invention.

Figure 9B:
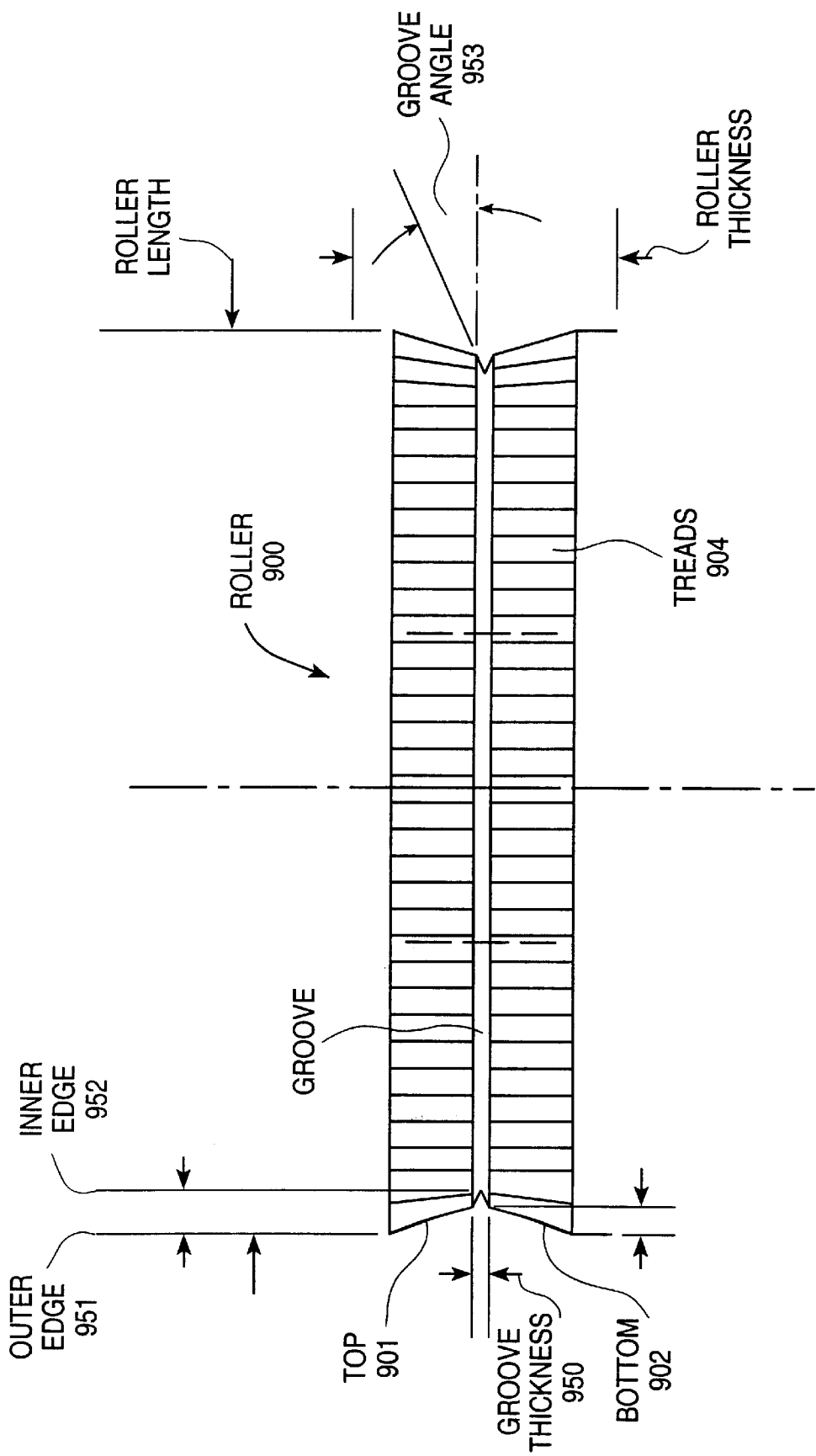

In one embodiment, the roller includes treads that extend from the groove to the outer edges of the roller at the top and the bottom. Such a roller is shown in FIG. 9B. These treads operate the channel fluids, solutions and liquids away from the groove during operation. It is particularly advantageous when leaning solutions are being used in the process. For more information on a roller with treading, see co-pending and concurrently filed application Ser. No. 08/705,337 entitled "Roller with Treading and System Including the Same", filed Aug. 29, 1996, now U.S. Pat. No. 5,862,560 assigned to the corporate assignee of the present invention.

Figure 10A:
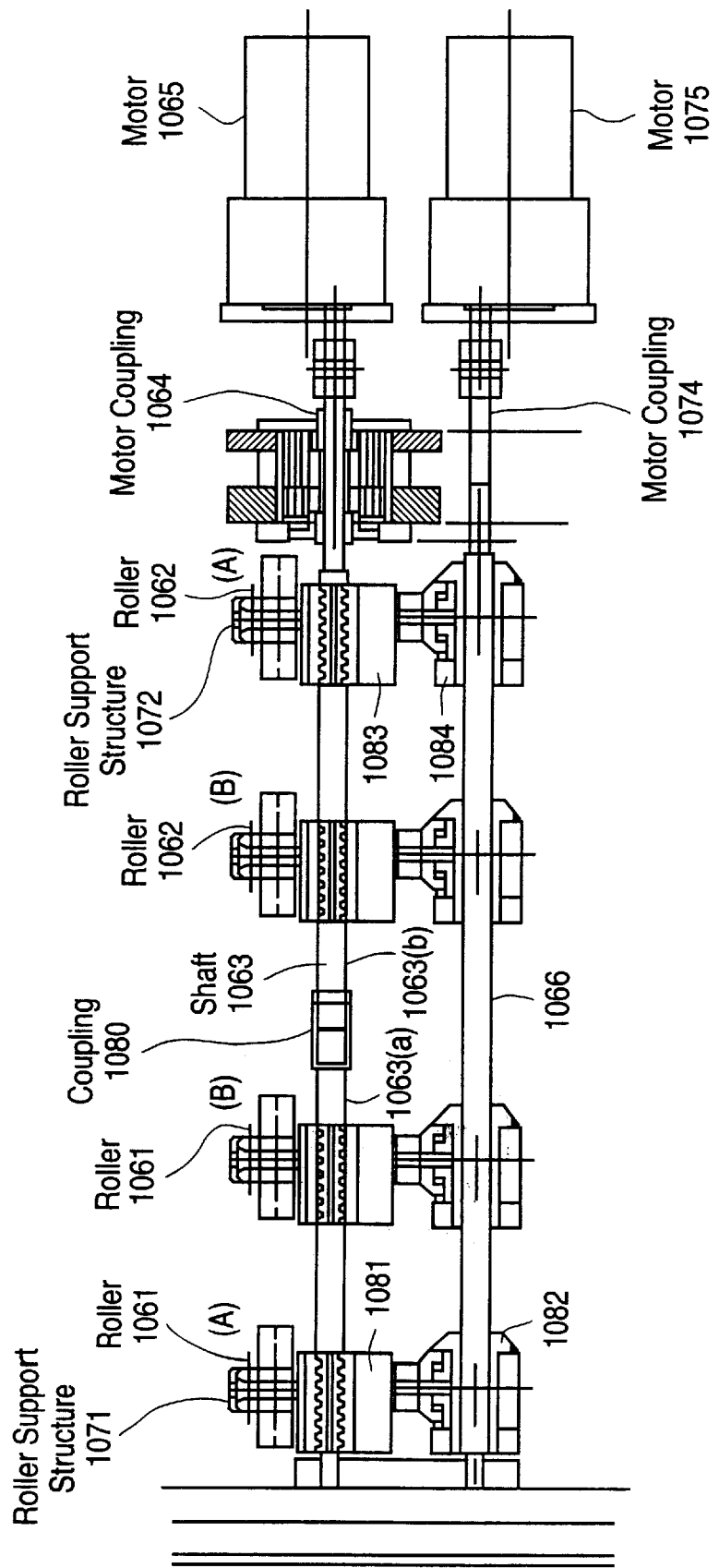
FIG. 10A illustrates a section view of an embodiment of a roller positioning apparatus to position the rollers in a scrubber system.

FIG. 10A illustrates an embodiment to move the rollers in position in a scrubber system. Note that only those portions of the brush station pertinent to the disclosure of the present invention have been shown to avoid obscuring the present invention. Referring to FIG. 10A, two rollers 1061 and 1062 are shown at two substrate manipulation devices or different positions (A, B). Position A is at a stowed position, while position B is at a 4 in. wafer position (where the system is operating on 4 inch wafers). The roller positioning apparatus may operate with 4, 5, 6, 8, 12 inch wafers or any other size wafer.

Each of rollers 1061 and 1062 is coupled to roller support structures 1071 and 1072 respectively, which are coupled to two shafts 1063 and 1066. In one embodiment, each support structure comprises a tractor described below. Each of support structures 1071 and 1072 includes an inner member or shaft coupled to its respective roller and rotatably coupled 1207 (see FIG. 12A) to two shaft attachment mechanisms (shaft attachment mechanisms 1081, 1082, 1083, 1084).

Shaft 1063 comprises a right-hand threaded end 1063(*a*) and a left-hand threaded end 1063(*b*) forming a single double helical lead shaft. In another embodiment, a coupling 1080 is used to couple two separate shafts together that have threads of opposite directions. Shaft 1063 is coupled via a motor coupling 1064 to a motor 1065 which causes the shaft 1063 to rotate. Shaft attachment mechanisms 1081 and 1083 include threads for rotatably coupling to the threads on shafts 1063($a$) and 1063($b$) respectively. In an alternative embodiment described below, two pins form the mating thread. Thus, the present invention uses a treaded drive rod with left and right threaded to move rollers into position.

Shaft 1066 is coupled to the lower end of each of rollers 1061 and 1062 in shaft attachment mechanisms 1082 and 1084, which slide on shaft 1066 through the use of bearings. In one embodiment, shaft 1063 is a round shaft while shaft 1066 is a square-shaped shaft.

When shaft 1063 is rotated, the support structures 1071 and 1072 including the rollers 1061 and 1062 move along the shaft 1063 and slide along shaft 1066 which acts as a linear guide to maintain the alignment of rollers 1061 and 1062 with respect to the wafer. In one embodiment, by rotating the double helical lead screw clockwise, the support structures 1071 and 1072 and their associated rollers move away from each other. If the lead screws are rotated counterclockwise, then the support structures and their associated rollers move closer together.

Figure 12A:
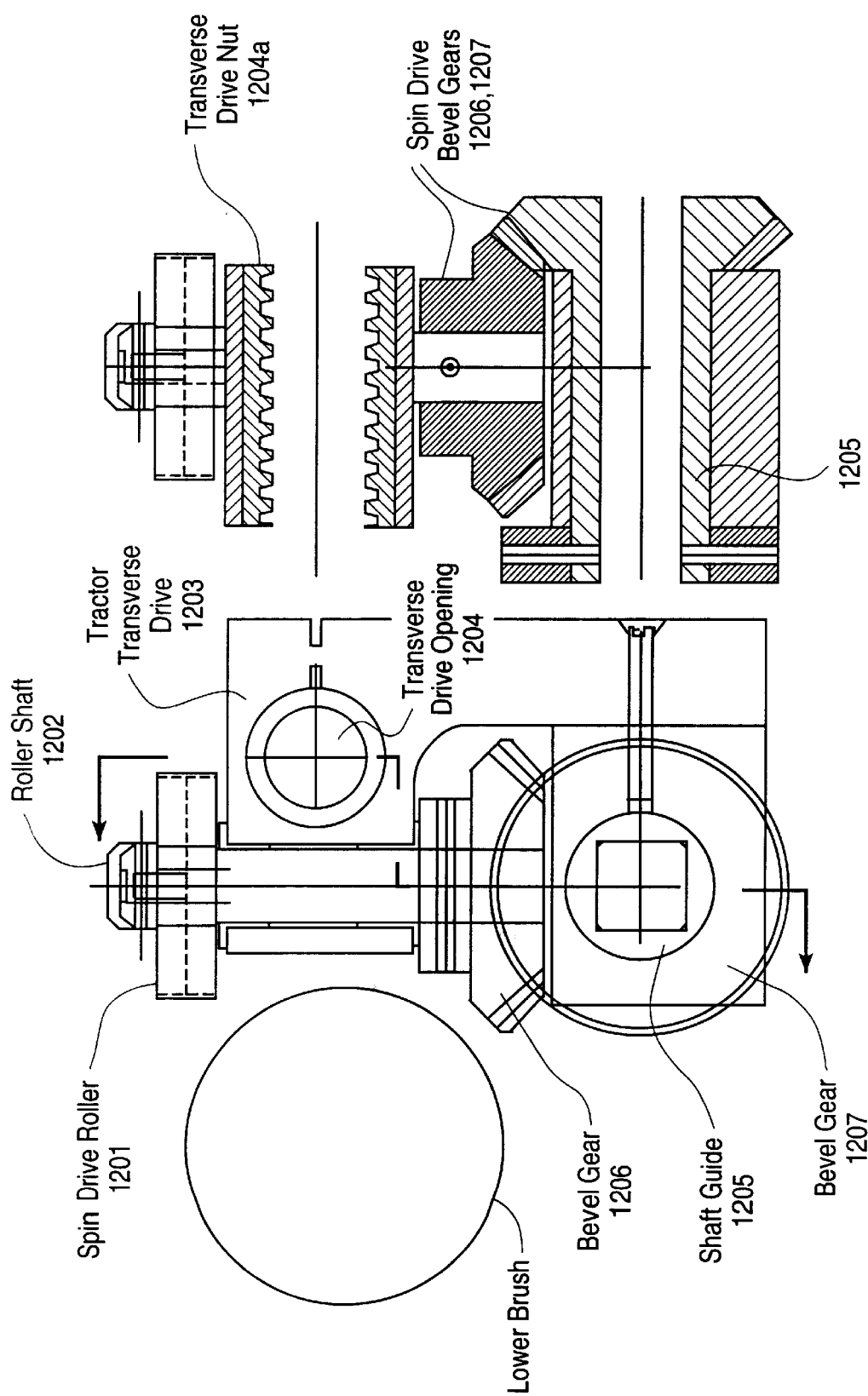
FIG. 12A illustrates one embodiment of a tractor assembly of the present invention.

Although shaft 1066 maintains the alignment of rollers 1061 and 1066 with respect to the wafer, shaft 1066 is also rotated via motor 1075 and motor coupling 1074 to impart rotation motion to the rollers. When the rollers are in contact with the wafer, friction is created between their edges. The rotation motion of the rollers and the friction that is created cause the wafer to rotate. This rotation of the wafer between the brushes allows the entire surface of the wafer to be cleaned. The two rollers contact the wafer at two locations to rotate the wafer and to hold it in place (ie., prevent forward motion) as it is scrubbed. In one embodiment, shaft attachment mechanisms 1082 and 1084 include a set of bevel gears which are coupled between shaft 1066 and rollers 1061 and 1062 to impart that rotation motion. One embodiment of this beveled gear arrangement is shown in FIGS. 12A and 12B, and is discussed below.

Note that shaft 1066 is coupled, in part, to the roller support structures 1071 and 1072 through the use of bearings, which permit support structures 1071 and 1072 to slide along shaft 1066 while it is rotating.

Shafts 1063 and 1066 are coupled for rotation to one side of the brush box via bearings. In one embodiment, the bearings are plastic.

Figure 10B:
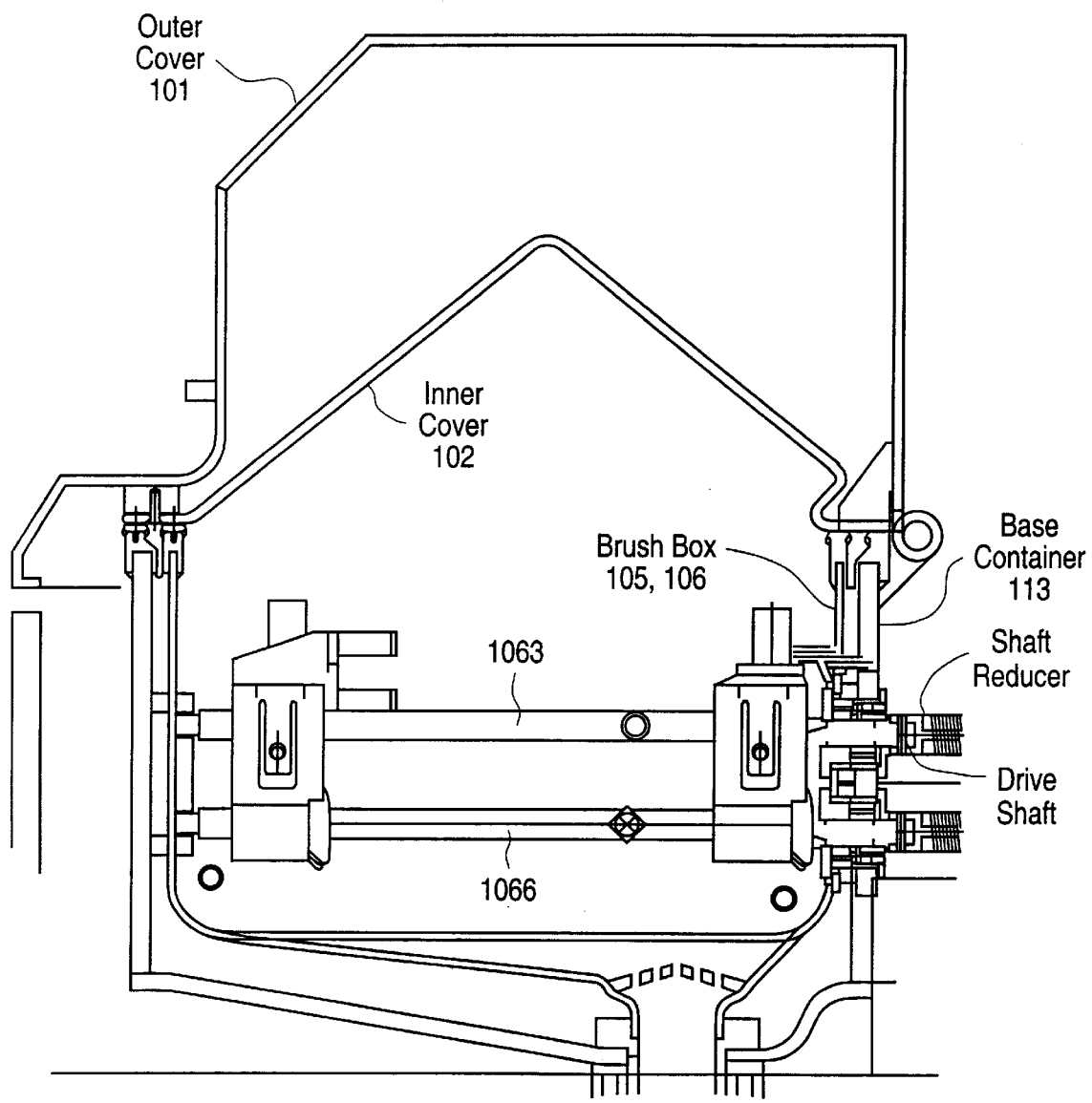
FIG. 10B illustrates the roller positioning apparatus of FIG. 10A coupled in one of the brush boxes.

FIG. 10B illustrates the roller positioning mechanism coupled in one of the brush boxes. Note that motors 1065 and 1075 (not shown) are outside of the inner chamber of the brush box with motor coupling occurring at the wall of the base container 113.

Figure 11:
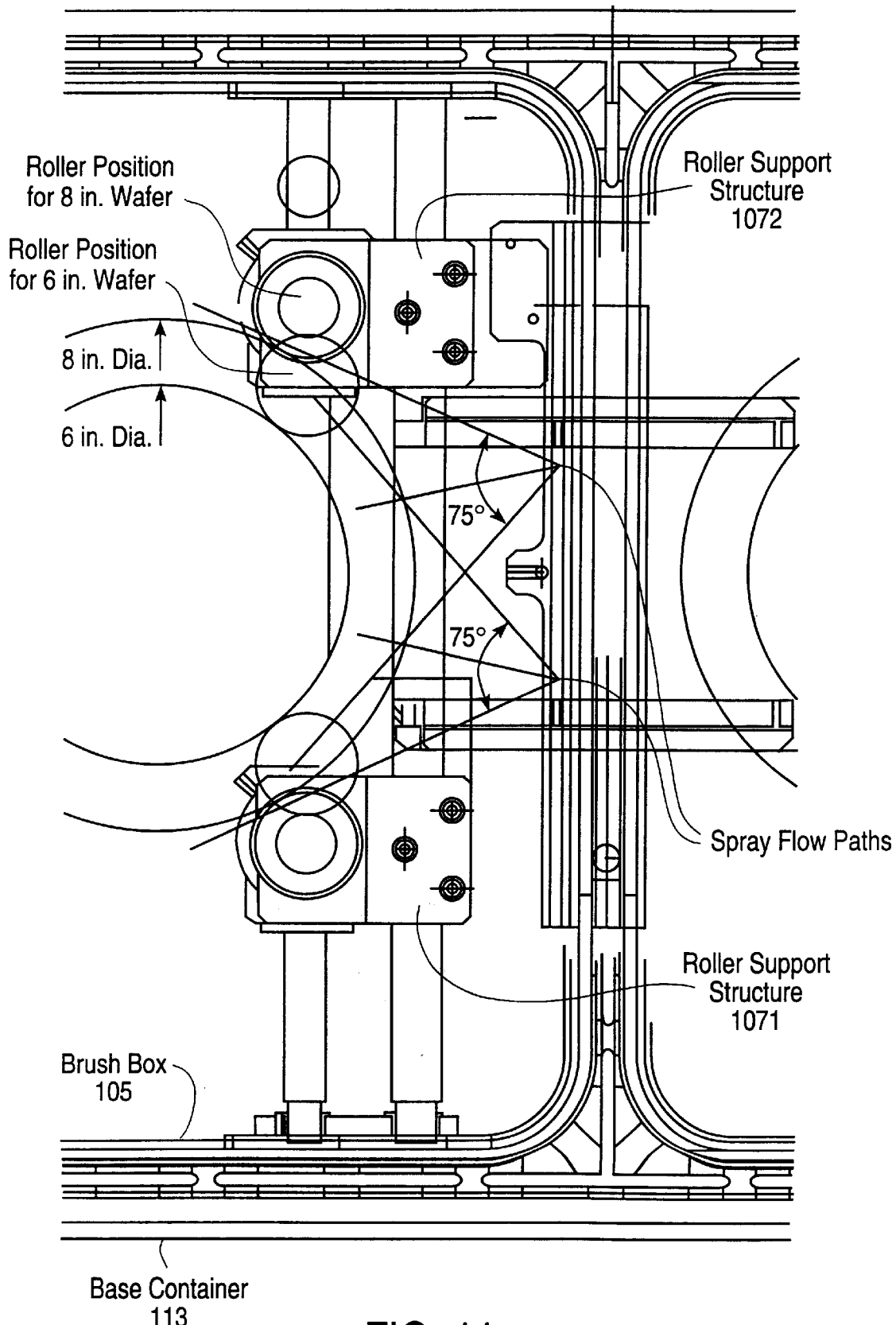
FIG. 11 illustrates a top view of the roller positioning apparatus in a brush box.

FIG. 11 illustrates a top view of the roller positioning apparatus in brush box 105. Also illustrated are roller positions for eight inch and six inch diameter wafers. In one embodiment, sensors may be used for wafer placement and to find the flats on the wafer. Such sensors are well-known in the art. Similarly, two sprayers flow paths from mounted sprays are illustrated in conjunction with the roller positioning apparatus.

FIGS. 12A and 12B illustrate embodiments of the tractor assembly of the present invention. Referring to FIG. 12A, a spin drive roller 1201 is shown coupled to a roller shaft 1202. In one embodiment, tractor transverse drive 1203 includes transverse drive opening 1204 which includes traverse drive nut 1204$a$, which is threaded from one side of drive opening 1204 to the other.

Roller shaft 1202 is coupled to the spin drive bevel gear 1206 which is rotatably coupled to the spin drive bevel gear 1207. The spin drive bevel gear 1207 is coupled to shaft 1066 (see FIG. 10A) which is inserted in shaft guide 1205. In one embodiment, the bevel gears comprise mitre gears. When the (square) shaft 1066 rotates, the bevel gear 1207 rotates. The rotation motion of bevel gear 1207 rotates bevel gear 1206, which in tun rotates the roller 1201. Note that the lower brush is shown as a reference to the tractor assembly.

In one embodiment, all of the components are HF compatible. Plastic components may comprise PET natural, Teflon, PVA, etc. In one embodiment, metal components may comprise stainless steel such as C276.

In an alternative embodiment, two pins spaced 180° apart form the mating thread. Such an embodiment is shown in FIG. 12B.

Figure 12C:
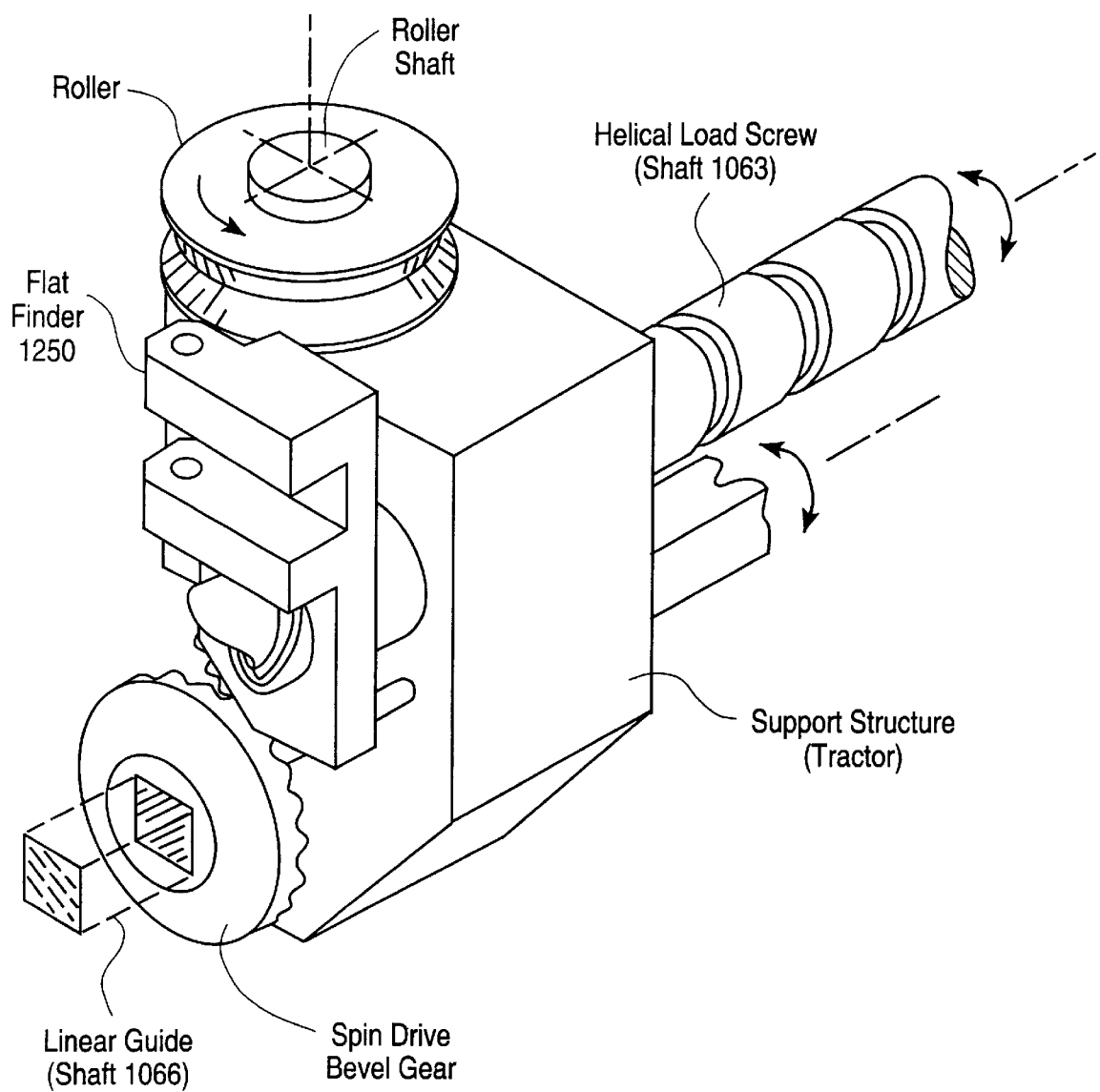
FIG. 12C illustrates a perspective view with one embodiment of a tractor assembly having a flat finder.

FIG. 12C illustrates a perspective view of another embodiment of the tractor assembly of the present invention. Referring to FIG. 12C, the tractor assembly is shown having one embodiment of an integrated flat finder. The use and operation of flat finders is well-known in the art.

Figure 13:
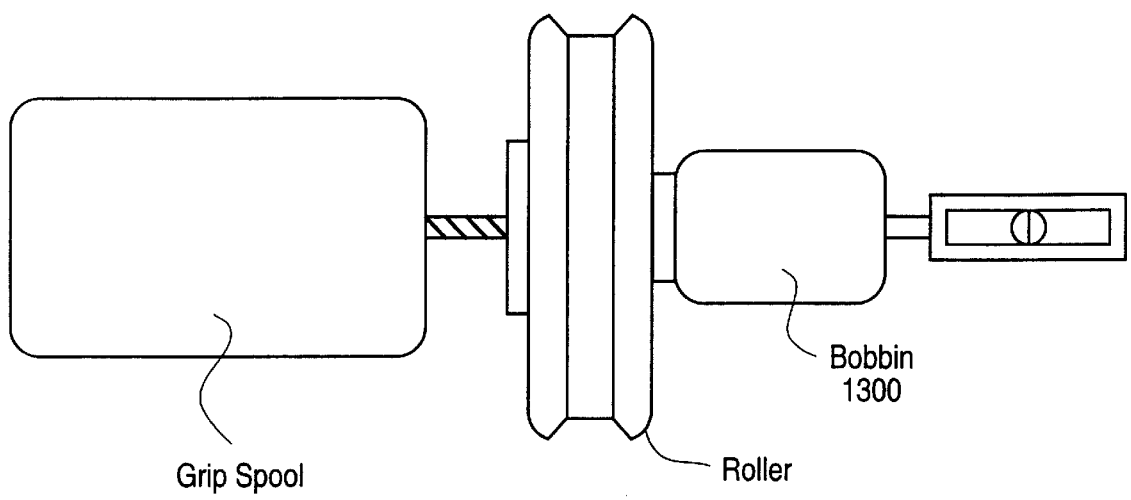
FIG. 13 illustrates one embodiment of an extractable roller on a bobbin combination.

In one embodiment, the roller is on a bobbin with a square shaft or pin. The square shaft may be pulled from and inserted into a similarly shaped (square) opening at the top of the tractor. The square shaft, when fully inserted, engages with a housing that supports bevel gear 1206 (FIG. 12$a$). Note that any shape shaft may be used as long as the shaft moves in response to rotation of bevel gear 1206. The square shaft includes a threaded screw that allows the roller to be adjusted in height. By allowing the roller to be adjusted in height, the roller keeps the wafer on a horizontal plane. In other words, the threaded screw allows the roller to move up and down based upon the brush pressure placed on the wafer by the brushes. FIG. 13 illustrates one embodiment of the roller being on a bobbin 1300.

It should be noted that by allowing the roller to be on a removable bobbin, the rollers may be easily replaced. Furthermore, the removable roller allows a system user to better access a wafer in the brush box. When used in an HF or highly acidic process, the roller pin is made of Hastiloid material. In another embodiment, the roller pin may be made of plastic.

In an alternate embodiment, the rollers are positioned using swing arms which when rotated from an initial position allow a roller to receive the wafer and swing outward as the wafer travels through the processing station. As in the previous embodiment, a motor operates to rotate the roller. A stepper motor rotates the swing arm. For information on the roller, see U.S. patent application Ser. No. 08/275,639, entitled "Hesitation Free Roller", filed Jul. 15, 1994, now abandoned and assigned to the corporate assignee of the present invention.

An Exemplary Scrubber

Figure 14:
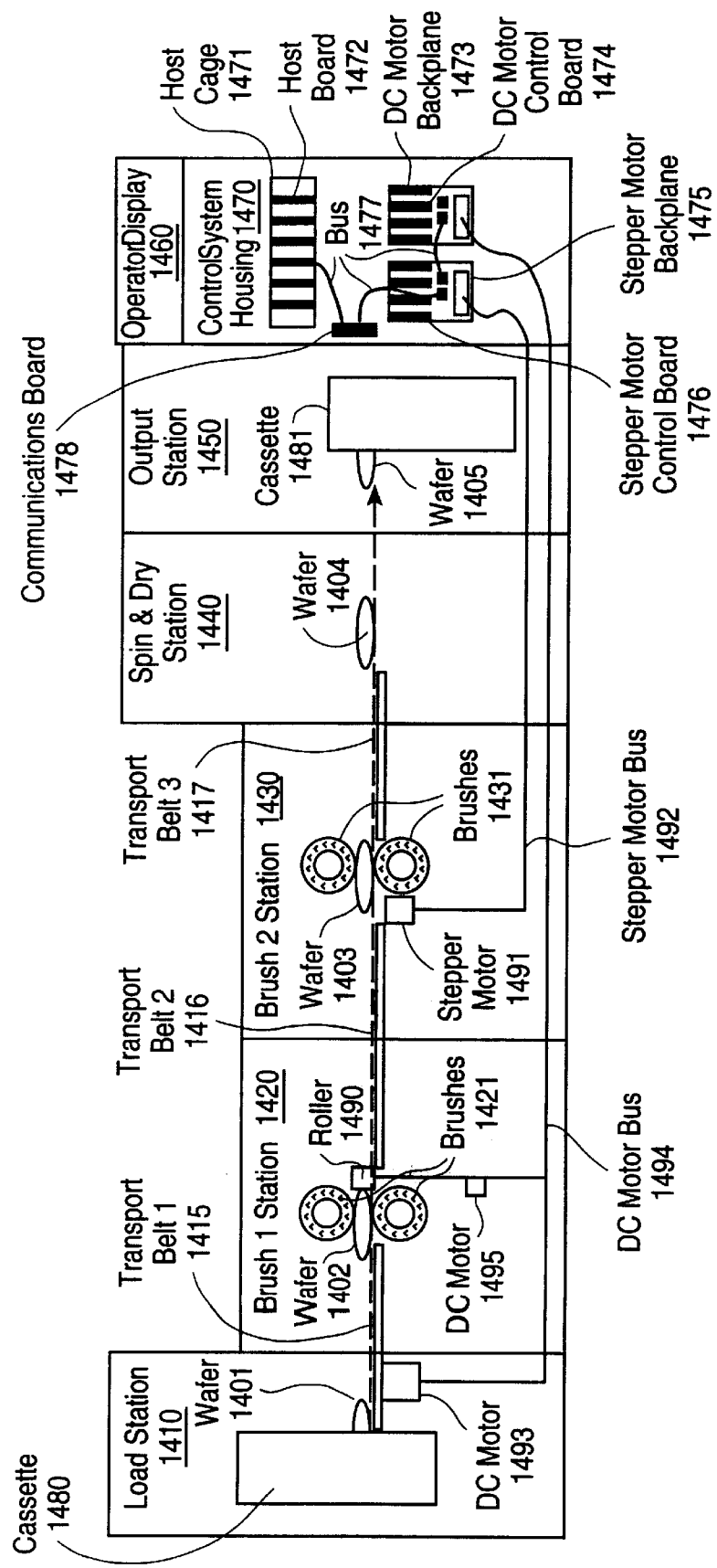
FIG. 14 illustrates an exemplary scrubber system.

FIG. 14 illustrates a conceptual view of a double sided wafer scrubber (scrubber) as may be used by one embodiment of the present invention. The scrubber includes a number of stations. Each of theses stations logically represent one or more steps m the wafer cleaning process. These stations can also include the hardware and software that completes one of the steps in the cleaning process. The cleaning process includes the steps executed by the scrubber on the wafers. In one embodiment, the scrubber can process multiple wafers simultaneously; one or more wafers are being processed in each of the stations at a point in time.

Dirty wafers are loaded at one end of the scrubber; clean wafers are unloaded from the other end of the scrubber.

In load station 1410 (also known as the input station), the operator loads a cassette 1480 into the scrubber. The cassette 1480 contains a number of dirty wafers. Wafers are automatically moved from load station 1410 to brush 1 station 1420 on Transport Belt 1, 1415. Transport Belt 11415 is moved by DC motor 1493. Wafer 1401 represents a dirty wafer being automatically removed from cassette 1480 and placed on Transport Belt 1,1415.

In brush 1 station 1420, a dirty wafer 1402, is brushed and sprayed (water jets not shown), to remove some of the particles from the dirty wafer 1402. Brushes 1421 scrub both sides of the dirty wafer 1402. The height of the top brush is controlled by a stepper motor (not shown). Roller 1490 rotates dirty wafer 1402. In one embodiment, the edge and bevel areas of a wafer are cleaned using an abrasive material on the roller. Enhanced cleaning may be obtained when there is a vecolity differential between the roller and the wafer.

The once brushed wafers are then automatically moved to brush 2 station 1430. This is done by Transport Belt 21416, controlled by a second DC motor (not shown).

In brush 2 station 1430, a once brushed wafer 1403 is brushed and sprayed (water jets not shown), to remove more of the particles from the once brushed wafer 1403. Brushes 1431 scrub both sides of the once brushed wafer 1403. The height of the top brush of brushes 1431 are controlled by stepper motor 1491. The twice brushed wafers are then automatically moved to spin & dry station 1440, via Transport Belt 21416.

Spin & dry station 1440 rinses the wafers, spins them, and dries them. Wafer 1404 represents a wafer being processed in the spin & dry station 1440. At this point, the wafer has been cleaned. Note, for one particular type of wafer, the wafer must have been kept wet during the load station 1410, brush 1 station 1420, and brush 2 station 1430. Only after being brushed and rinsed can this type of wafer then be spun and dried. The spun and dried wafer is then moved to the output station 1450.

In output station 1450, the clean wafer is put into a cassette 1481. Wafer 1405 represents a clean wafer being put into cassette 1481. The cassette 1481, when full of clean wafers, can then be removed by the operator. This completes the cleaning process.

Control system housing 1470 houses a number of components that comprise the heart of the control system for the scrubber. Control system housing 1470 includes a host cage 1471 having a host board 1472. The host board 1472 provides the overall control for the scrubber. The host board 1472 typically includes one or more host processors implemented in one or more physical packages. The host cage 1471 provides support for the host board 1472 and other boards in the host cage (e.g. sensor input boards, a video card for operator display 1460, a board for communicating signals from the host board 1472 to the rest of the control system).

The host board can communicate to the rest of the control boards through another board in the host cage 1471 (communication board 1478) or through a connector direct to the host board 1472. A control board is typically a modular circuit formed on a printed circuit board, that controls motors or other devices within a scrubber. Typically, communications from the host cage pass through a communications board 1478. The communications board, in turn, communicates with other devices through a bus 1477.

Bus 1477 supports an easily extensible and modular control system, in the scrubber of FIG. 14, the bus 1477 links the host board 1472, the communications board 1478, the stepper motor backplane 1475 and the DC motor backplane 1473. Messages between the various devices attached to the bus 1477 can be communicated according to a protocol described below. A message is a packet of information to be communicated from one point to another point.

The stepper motor backplane 1475 supports a stepper motor control board 1476. This stepper motor control board 1476 controls the movement of stepper motor 1491 via stepper motor bus 1492. Similarly, the DC motor backplane 1473 supports a DC motor control board 1474. The DC motor control board 1474 controls the movement of the DC motor 1493 and DC motor 1495 via DC motor bus 1494.

In one embodiment of the present invention, each of these backplanes support up to four motor control boards. However, one of ordinary skill in the art would understand that the present invention is not limited to backplanes that support only four motor control boards.

Operator display 1460 typically includes a monitor like a cathode ray tube, or flat panel display. In one embodiment, operator display 1460 also includes a touch sensitive screen allowing the operator to interact with the scrubber control system.

Note that FIG. 14 is a conceptual drawing. Some components are represented by one symbol so as to not overly obscure the present invention. For example, it is possible to have Transport Belt 3 1417 be made of two or more physical transport belts, each belt being moved by a different DC motor.

Whereas many alterations and modifications of the present invention will no doubt become apparent to a person of ordinary skill in the art after having read the foregoing description, it is to be understood that the various embodiments shown and described by way of illustration are in no way intended to be considered limiting. Therefore, references to details of various embodiments are not intended to limit the scope of the claims which in themselves recite only those features regarded as essential to the invention.

Thus, a brush assembly apparatus has been described.

We claim:

1. A brush box containment apparatus for use in scrubbing a substrate, said brush box containment apparatus comprising:

a first brush box;

a second brush box;

a base container configured to have disposed therein the first brush box and the second brush box; and an outlet slot in the first brush box configured to open into an inlet slot in the second brush box thereby forming a passage through which the substrate can transition from the first brush box to the second brush box.

2. A brush box containment apparatus for use in scrubbing a substrate as recited in claim 1, further comprising:

a first pair of brushes contained within the first brush box; and a second pair of brushes contained within the second brush box.

3. A brush box containment apparatus for use in scrubbing a substrate as recited in claim 2, further comprising:

an entry slot defining an initial entrance path into the first brush box; and an exit slot defining a final exit path out of the second brush box.

4. A brush box containment apparatus for use in scrubbing a substrate as recited in claim 3, wherein the substrate is configured to transition through the first brush box and the second brush box by moving through the entry slot, the outlet slot, the inlet slot, and the exit slot.

5. A brush box containment apparatus for use in scrubbing a substrate as recited in claim 1, further comprising:

an inner cover, the inner cover being configured to enclose the first brush box and the second brush box during substrate scrubbing.

6. A brush box containment apparatus for use in scrubbing a substrate as recited in claim 5, further comprising:

an outer cover being configured to mate over the inner cover.

7. A brush box containment apparatus for use in scrubbing a substrate as recited in claim 1, further comprising:

a first drain defined in each of the first brush box and a first location in the base container; and a second drain defined in each of the second brush box and a second location in the base container.

8. A brush scrubbing enclosure apparatus, comprising:

a first brush box;

a second brush box;

a base container configured to have disposed therein the first brush box and the second brush box;

an entry slot defining a path into the first brush box for a substrate;

an outlet slot defining an exit path out of the first brush box for the substrate;

an inlet slot defining a path into the second brush box for the substrate; and an exit slot defining a path out of the second brush box for the substrate;

wherein each of the first brush box and the second brush box includes pairs of brushes for scrubbing the substrate.

* * * * *